United States Patent [19]
Bawolek et al.

[11] Patent Number: 6,130,422
[45] Date of Patent: Oct. 10, 2000

[54] EMBEDDED DIELECTRIC FILM FOR QUANTUM EFFICIENCY ENHANCEMENT IN A CMOS IMAGING DEVICE

[75] Inventors: Edward J. Bawolek, Chandler; Robert C. Sundahl, Phoenix, both of Ariz.; Berni W. Landau, Beaverton, Oreg.; Stephen B. Gospe, Fremont; Jack S. Uppal, San Jose, both of Calif.; Jung S. Kang, Chandler, Ariz.

[73] Assignee: Intel Corporation, Santa Clara, Calif.

[21] Appl. No.: 09/106,738

[22] Filed: Jun. 29, 1998

[51] Int. Cl.$^7$ .................................................. H01L 27/00
[52] U.S. Cl. ...................... 250/208.1; 250/214.1; 257/649
[58] Field of Search ............................ 250/208.1, 216, 250/214.1; 257/640, 639, 649, 461

[56] References Cited

U.S. PATENT DOCUMENTS

| | | | |
|---|---|---|---|
| 5,440,130 | 8/1995 | Cox et al. ...................... | 250/370.09 |
| 5,448,097 | 9/1995 | Mizushima et al. ................. | 257/644 |
| 5,463,225 | 10/1995 | Kwasnick et al. ................ | 250/370.11 |
| 5,811,872 | 9/1998 | Machida et al. .................. | 257/640 |

*Primary Examiner*—Que T. Le
*Attorney, Agent, or Firm*—Blakely, Sokoloff, Taylor & Zafman LLP

[57] ABSTRACT

The present invention is an image sensor and its fabricating method. The image sensor comprises a photodiode and a dielectric structure. The photodiode is responsive to an amount of incident light from a light source. The dielectric structure is on top of the photodiode and is placed between the photodiode and an inter-level dielectric (ILD) oxide layer. The dielectric structure contains a dielectric material. The ILD oxide layer is made of an oxide material and has an ILD oxide thickness.

29 Claims, 26 Drawing Sheets

EMBEDDED DIELECTRIC FILM FOR QUANTUM EFFICIENCY ENHANCEMENT IN A CMOS IMAGING DEVICE

BACKGROUND OF THE INVENTION

1. Field of the Invention

This invention relates to image sensors. In particular, the invention relates to enhancement of quantum efficiency in a complementary metal oxide semiconductor (CMOS) imaging device.

2. Description of Related Art

The light sensitivity of an image sensor is determined, in part, by the quantum efficiency (QE) of the photodiode used to convert photons into charge within a pixel. The QE is determined by a number of factors, some of which are constrained by the fundamental physics or material properties.

A common loss mechanism which reduces the QE of a photodiode is surface reflection. Whenever a ray of light crosses a boundary between two materials, a portion of the ray will be reflected from the interface. The amount reflected will increase with the degree of mismatch between the refractive indices. For example, a ray of light traversing air-glass, oxide-silicon, and air-silicon interfaces typically experiences approximately 4%, 15%, and 38% reflective losses, respectively. The high refractive index of silicon results in a large mismatch with most transparent (non-absorbing) optical materials and/or air. Thus, reflective losses at the silicon surface can be problematic.

Anti-reflection (AR) coating is used to reduce the reflection and increase the QE. However, the use of AR coating has a number of disadvantages.

First, the behavior of the AR coating depends on the amount of optical interference. This behavior, in turn, requires certain physical conditions to be met. This condition is increasingly difficult to meet as the film thickness increases, with one to two microns ($\mu$m) representing a practical limit for observing these effects. Many image sensors have dielectric and passivation stacks several microns thick. This can effectively preclude the use of an AR coating on the top of the sensor for the purpose of modifying the reflective loss at the oxide-silicon interface.

Second, a conventional AR coating is created by sputtering a material of low refractive index (such as MgF). These materials may not be compatible with a given silicon device technology.

Third, conventional AR coatings from a single film can be optimized for preventing reflection loss at a single wavelength. An AR coating which is capable of preventing reflection loss over a range of wavelengths must be fabricated from multiple films of alternating high and low refractive indices. This adds to fabrication cost and complexity, and may also not be compatible with all silicon device technologies.

Therefore there is a need in the technology to provide a method to increase the QE without imposing constraints on the device thickness and provide additional benefits in the manufacturing process.

SUMMARY OF THE INVENTION

The present invention is an image sensor and its fabricating method. The image sensor comprises a photodiode and a dielectric structure. The photodiode is responsive to an amount of incident light from a light source. The dielectric structure is on top of the photodiode and is placed between the photodiode and an inter-level dielectric (ILD) oxide layer. The dielectric structure contains a dielectric material. The ILD oxide layer is made of an oxide material and has an ILD oxide thickness.

BRIEF DESCRIPTION OF THE DRAWINGS

The features and advantages of the present invention will become apparent from the following detailed description of the present invention in which:

FIG. 3O is a diagram illustrating a step of SRM ash/sulfuric clean in a fabrication process of the image sensor according to one embodiment of the invention.

DESCRIPTION OF THE PRESENT INVENTION

The present invention is a technique to fabricate a CMOS image sensor with high quantum efficiency (QE). A dielectric film is embedded near the silicon-oxide interface with a suitable thickness. The thickness can be adjusted during the manufacturing process to provide a range of filtering performance.

In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention.

Figure 1:
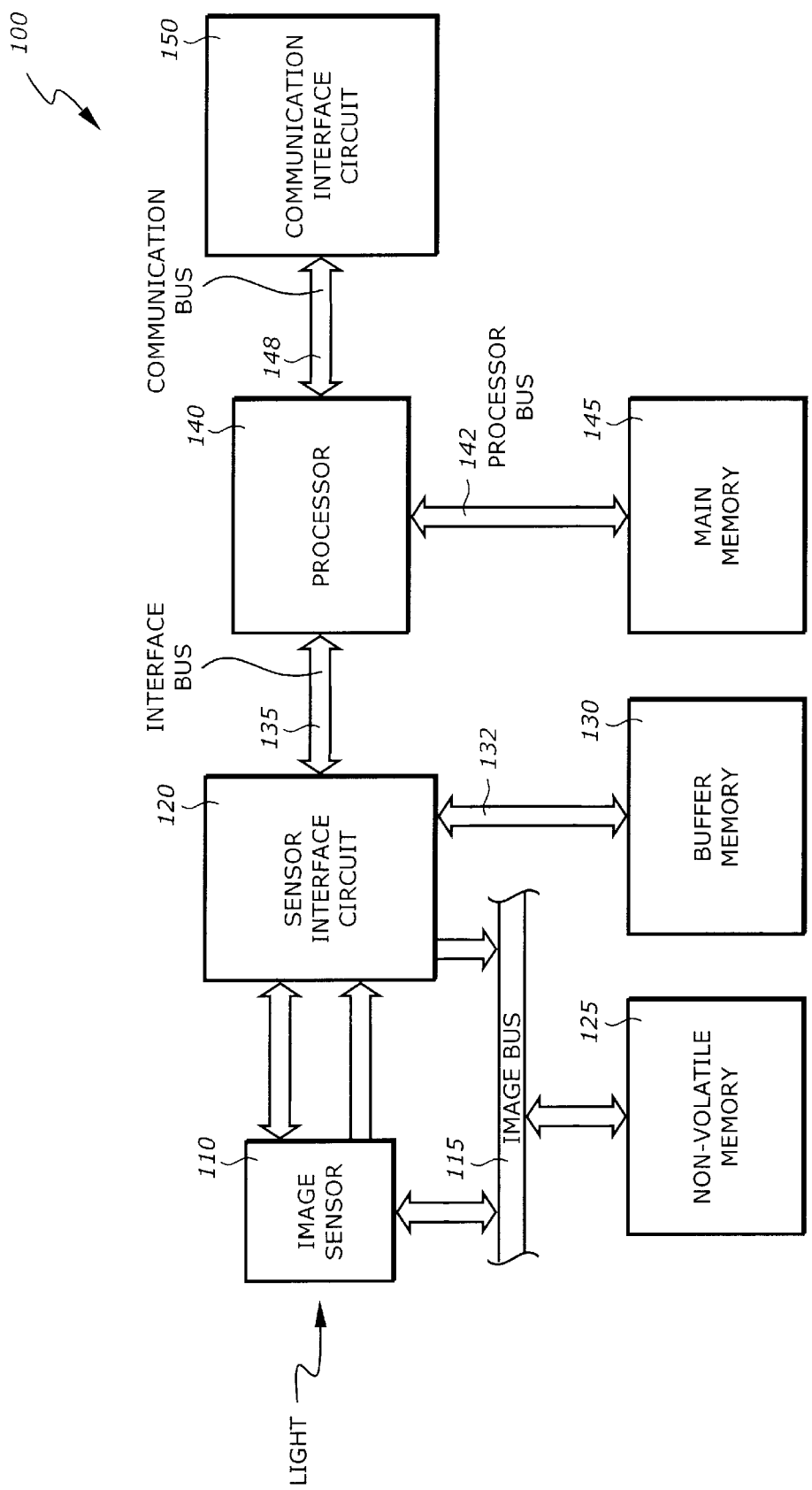
FIG. 1 is a diagram illustrating one embodiment of an imaging system in accordance with the teachings of the invention.

FIG. 1 is a diagram illustrating one embodiment of an imaging system within which one embodiment of the present invention may be utilized. The imaging system 100 includes an image sensor 110, a sensor interface circuit 120, an image bus 115, a non-volatile memory 125, a buffer memory 130, a buffer memory bus 132, an interface bus 135, a processor 140, a processor bus 142, a main memory 145, a communication bus 148, and a communication interface circuit 150.

The image sensor 110 is a complementary metal oxide semiconductor (CMOS) device with enhanced quantum efficiency (QE). The image sensor 110 receives the light and responds with amount of electrical charges corresponding to the amount of light. The electrical charges are converted into appropriate current or voltage levels. The image captured by the image sensor is stored in form of a digital memory. The image sensor 110 is directly coupled to the image bus 115. In typical applications, a number of image sensors are used to form an image sensing array.

The sensor interface circuit 120 includes timing and control circuitry to control the image sensor 110 and to receive the image data as captured by the image sensor 110. The sensor interface circuit 120 also has access to the image bus 115 to the non-volatile memory 125. The non-volatile memory 125 stores one or more snap-shots of the images as captured by the image sensor 110. The sensor interface circuit 120 also has access to the buffer memory 130. The buffer memory 130 is any random access memory (RAM) type such as static RAM (SRAM) or dynamic RAM (DRAM). The buffer memory 130 stores the image data as obtained by the sensor interface circuit 120 via the buffer memory bus 132. The sensor interface circuit 120 transfers the image data stored in the buffer memory 130 to the processor 140 when requested by the processor 140.

The processor 140 receives and processes the image data from the sensor interface circuit 120. Examples of some image processing operations performed by the processor 140 include low-level filtering, contrast enhancement, and look-up table operations. The processor 140 may be any processing element such as a general purpose microcontroller, a special purpose image processor, or a digital signal processor. The processor 140 has access to a main memory 145. The main memory 145 is any random access memory (RAM) type such as SRAM or DRAM which contains temporary information, data, or program code to be utilized by the processor 140.

The communication interface circuit 150 allows the processor 140 to communicate with other devices via standard interface protocols. Some examples of the interface protocols include the serial interface, the parallel port interface, the universal serial bus (USB), and the Institute of Electrical and Electronics Engineers (IEEE) 1394 serial bus. The processor 140 exchange information with the communication interface circuit 150 through the communication bus 148. The communication bus 140 may be a serial or parallel bus.

Figure 2A:
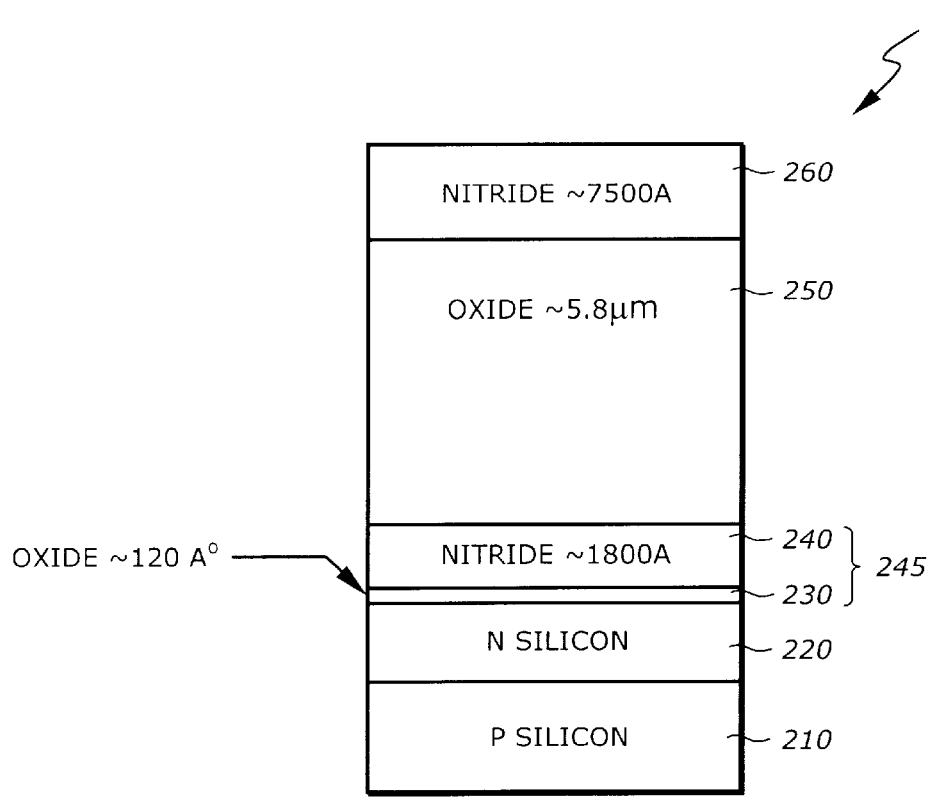
FIG. 2A is a diagram illustrating a cross section of an image sensor according to one embodiment of the invention.

FIG. 2A is a diagram illustrating a cross section of an image sensor according to one embodiment of the invention. The image sensor 110 includes a p-silicon layer 210, an n-silicon layer 220, a buffer oxide layer 230, a dielectric layer 240, an inter-level dielectric (ILD) oxide layer 250, and a passivation layer 260. The dielectric layer 240 and the buffer oxide layer 230 constitute a dielectric structure 245.

The p-silicon and n-silicon layers 210 and 220 form a photodiode that responds to light energy. The two layers 210 and 220 are formed during the process of fabricating a CMOS device such as a CMOS transistor.

The dielectric structure 245 includes the buffer oxide layer 230 and the dielectric layer 240. The buffer oxide layer 230 provides a buffer to relieve stress and prevent dislocation formation that would result from depositing dielectric material (e.g., nitride) directly on top of the photodiode. In one embodiment, the buffer oxide layer 230 has a thickness of approximately 120 angstrom (Å) (1 $\mu$m=10,000 Å), having a range of 100 Å to 200 Å. The dielectric layer 240 provides enhancement to the QE of the image sensor 110. The dielectric layer 240 also acts as a color tuning element to preferentially enhance the coupling of light within a specific portion of the visible spectrum. The dielectric layer 240 is made of any transparent material which has a refractive index different from (e.g., higher than) the surrounding matrix. In one embodiment, the dielectric layer 240 is made of nitride. The thickness of the dielectric layer 240 affects the QE and the spectral performance of the image sensor 110. Therefore, by adjusting the thickness of the first dielectric layer 240, the QE and/or the color filter performance can be fine tuned and varied according to the system requirements. This results in flexibility in the manufacturing process because image sensors with different characteristics can be fabricated in the same process with only minor changes in the thickness of the first dielectric layer 240. In one embodiment, the thickness of the first dielectric layer 240 is approximately 1,800 Å, having a range of 1,500 Å to 2,200 Å.

The ILD oxide layer 250 provides protection to the photodiode and the embedded dielectric layer 240. The ILD oxide layer 250 also provides the medium for routing and isolation of multiple metal lines in portions of the image sensor circuit apart from the photodiode. In one embodiment, the ILD oxide layer 250 has a thickness of approximately 5.8 µm, having a range of 5 µm to 6 µm. The buffer oxide layer 230 therefore has a thickness of less than 1% of that of the ILD oxide layer 250.

The passivation layer 260 is a coating designed to protect the image sensor assembly from moisture and contamination which could render the sensor inoperative. In one embodiment, the passivation layer 260 is made of nitride and has a thickness of approximately 7,500 Å, having a range of 7,000 Å to 8,000 Å.

By embedding the dielectric layer 240 between the two oxide layers 230 and 250 on the photodiode, the QE of the photodiode improves significantly.

Figure 2B:
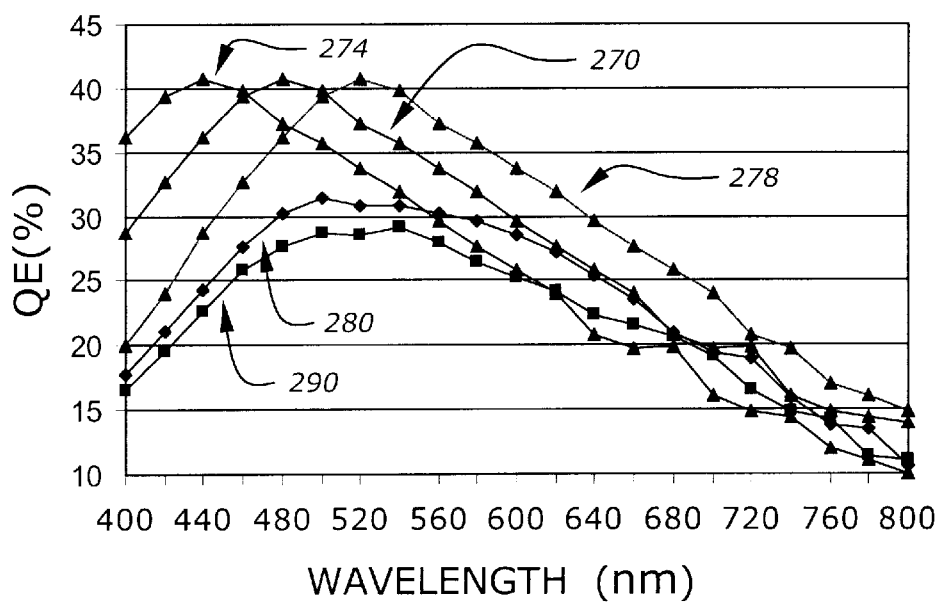
FIG. 2B is a diagram illustrating the quantum efficiency (QE) of the image sensor according to one embodiment of the invention in comparison with others.

FIG. 2B is a diagram illustrating the quantum efficiency (QE) curves of the image sensor according to one embodiment of the invention in comparison with others. The QE curves include enhanced QE curves 270, 274 and 278, and two non-enhanced QE curves 280 and 290 over the visible spectrum with wavelengths ranging from 400 nm to 800 nm.

The enhanced QE curves 270, 274, and 278 correspond to the image sensor as depicted in FIG. 2A with different thicknesses for the dielectric layer 240. The enhanced QE curves 270, 274, and 278 corresponds to thicknesses of approximately 1800 Å, 1600 Å, and 2000 Å, respectively. The enhanced QE curve 270 is plotted according to data obtained by actual experiments while the curves 274 and 278 are based on simulated data, with subsequent experimental validation. The thickness of 1800 Å for the dielectric layer 240 in FIG. 2A corresponds to the optical response within the normal visible spectrum as perceived by the human visual system. An increase in this thickness shifts the QE curve to the right while a decrease in this thickness shifts the QE curve to the left. Therefore, the dielectric layer 240 can be used as a filter to attenuate the light energy at some specified wavelength.

The non-enhanced QE curves 280 and 290 correspond to the image sensor without the dielectric structure 245. In other words, the QE curves 280 and 290 correspond to the image sensor comprising the p silicon layer 210, the n silicon layer 220, the ILD oxide layer 250, and the passivation layer 260. The dielectric structure 245 including the dielectric layer 240 and the buffer oxide layer 230 is absent.

As seen from FIG. 2B, the enhanced QE curve 270 indicates that the dielectric structure 245 in FIG. 2A improves the QE significantly. At wavelength 480 nm, the QE increases as much as 30% (from 30.3% to 40.8%).

The dielectric structure 245 can be easily fabricated with existing fabrication process because the materials to be deposited on the photodiode are available in existing process. For example, the dielectric layer 240 uses the nitride material which is also used for spacer nitride fabrication.

Figure 3A:
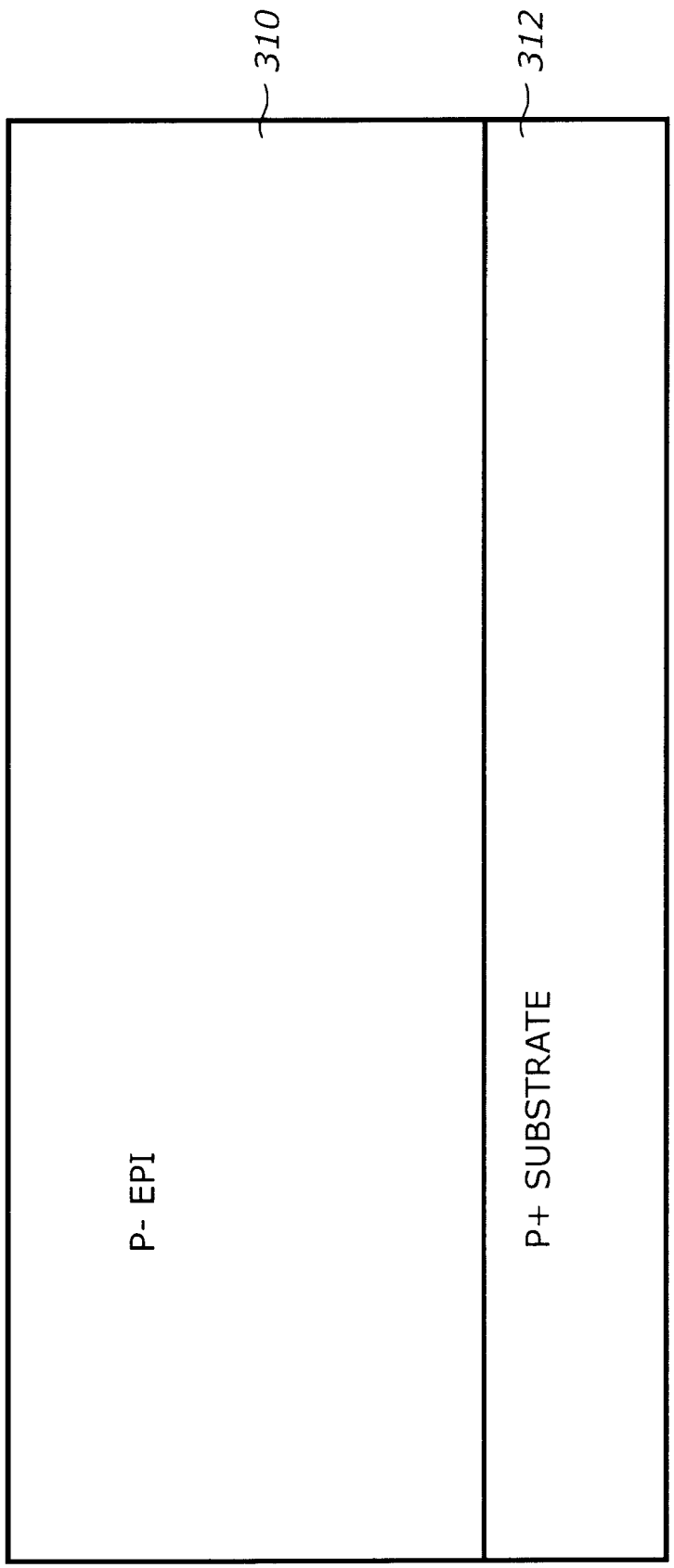
FIG. 3A is a diagram illustrating a step of wafer start in a fabrication process of the image sensor according to one embodiment of the invention.

The sequence of steps in the fabrication of the image sensor 110 follows essentially the steps used in the 0.35 µm for CMOS logic technology with the additional steps of creating the dielectric structure 245. FIGS. 3A through 3X illustrate a sequence of steps according to one embodiment of the invention.

FIG. 3A is a diagram illustrating a step of wafer start in a fabrication process of the image sensor according to one embodiment of the invention. This step includes forming a P– epitaxial layer 310 and a P+ substrate layer 312. In subsequent steps, the region on the left corresponds to an n-channel transistor structure and the region on the right corresponds to an image sensor structure.

Figure 3B:
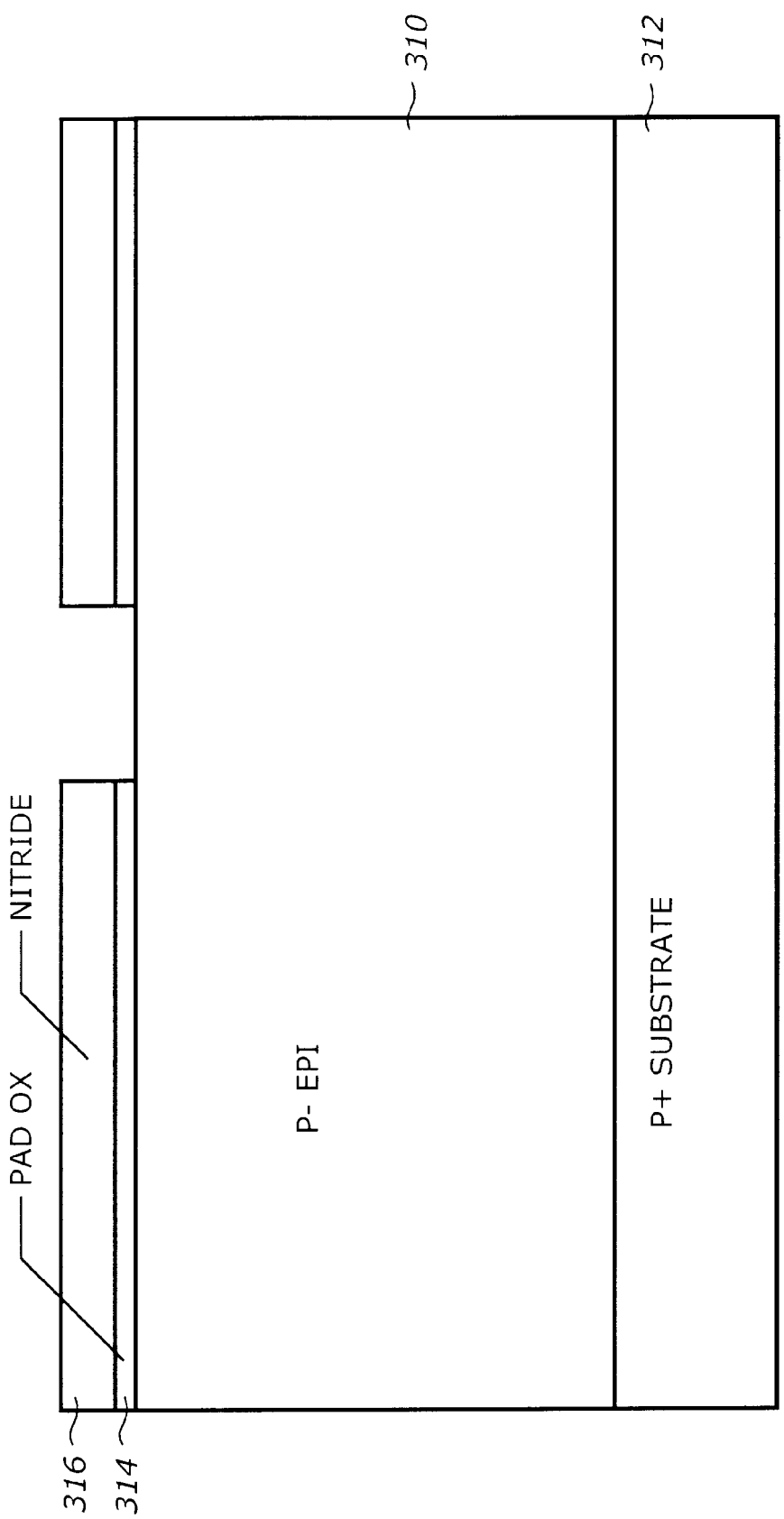
FIG. 3B is a diagram illustrating a step of pad oxide, nitride deposition, and shallow trench lithography in a fabrication process of the image sensor according to one embodiment of the invention.

FIG. 3B is a diagram illustrating a step of pad oxide, nitride deposition, and shallow trench lithography in a fabrication process of the image sensor according to one embodiment of the invention. This step includes forming a pad oxide layer 314 and depositing a nitride layer 316 on the P-epi layer 310. A shallow trench is then created by lithography and etch to separate the image sensor structure from the CMOS transistor structure.

Figure 3C:
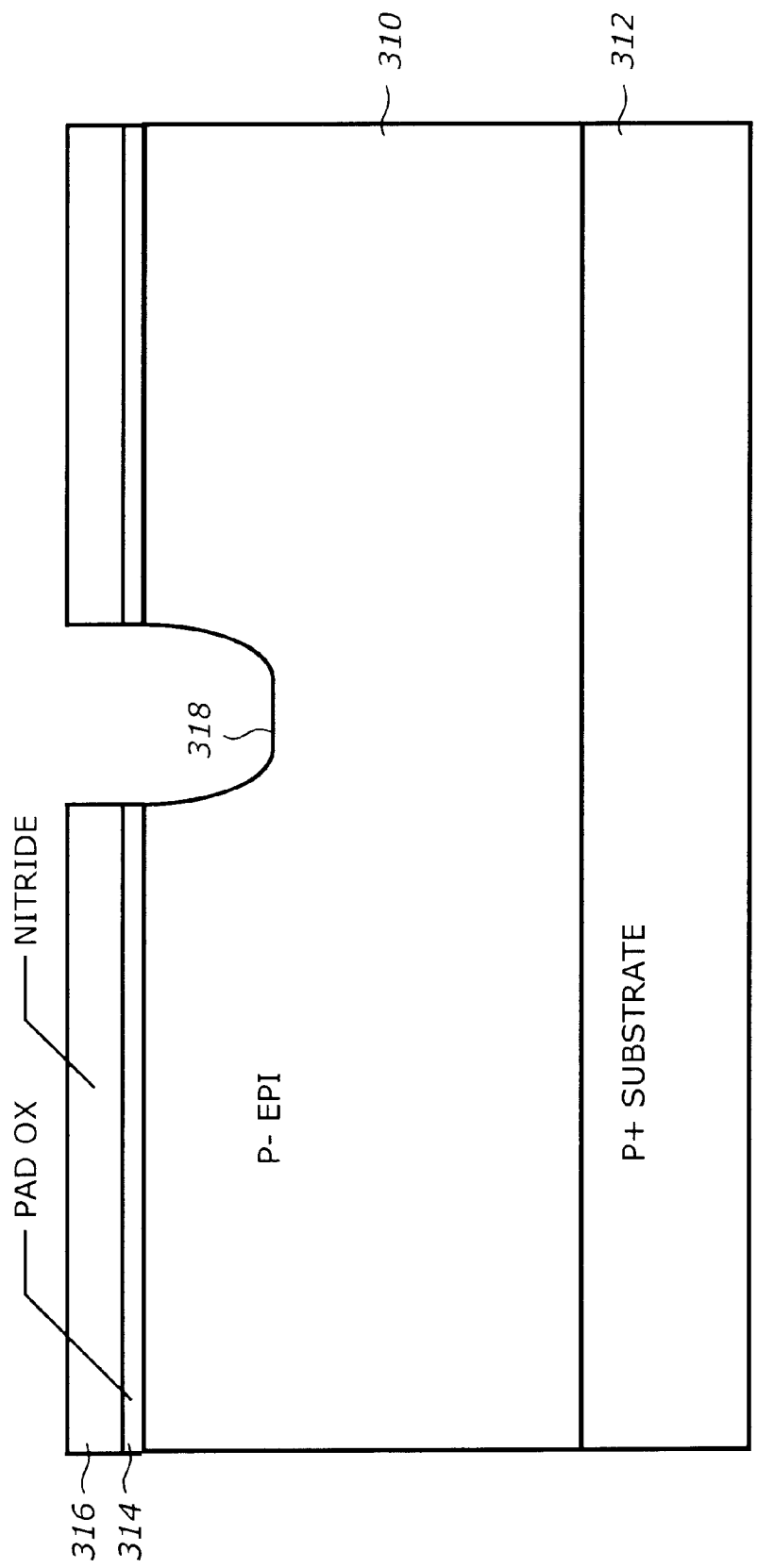
FIG. 3C is a diagram illustrating a step of shallow trench etch in a fabrication process of the image sensor according to one embodiment of the invention.

FIG. 3C is a diagram illustrating a step of shallow trench etch in a fabrication process of the image sensor according to one embodiment of the invention. This step includes etching the shallow trench 318 to go deeper in the P-Epi layer 310.

Figure 3D:
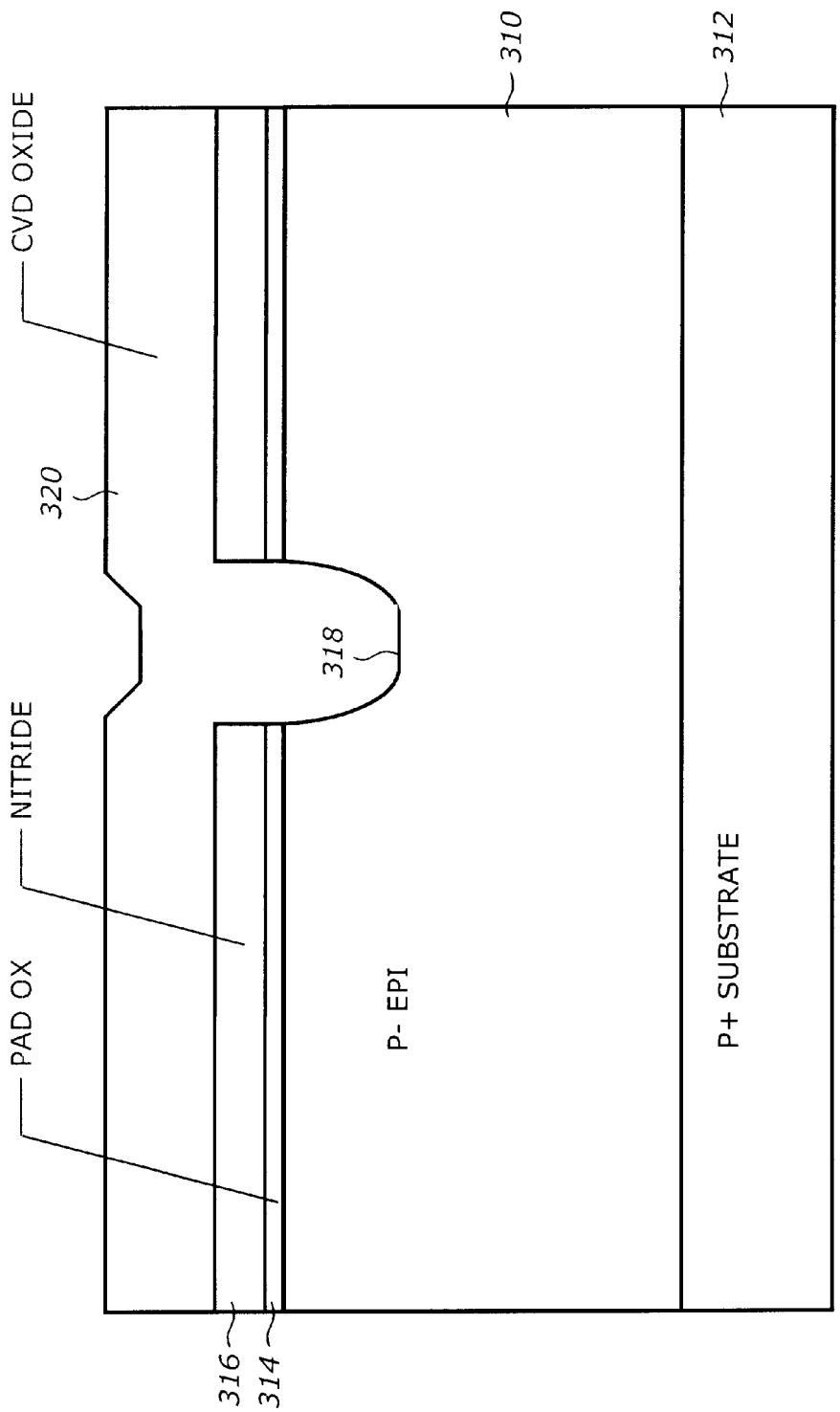
FIG. 3D is a diagram illustrating a step of shallow trench oxide fill in a fabrication process of the image sensor according to one embodiment of the invention.

FIG. 3D is a diagram illustrating a step of shallow trench oxide filling in a fabrication process of the image sensor according to one embodiment of the invention. This step includes filling the oxide 320 in the shallow trench by chemical vapor deposition (CVD). The oxide filling covers the nitride layer 316 and the shallow trench 318.

Figure 3E:
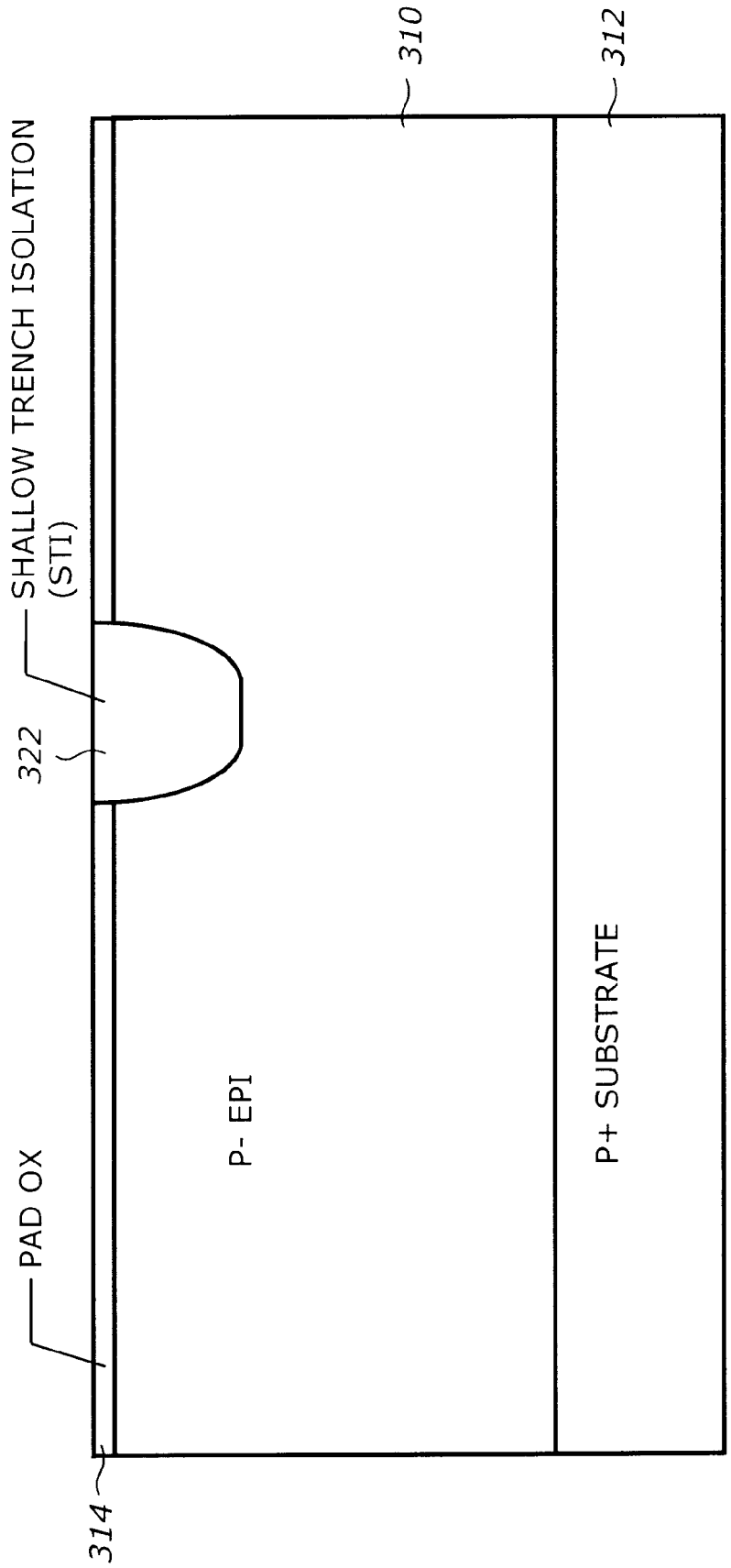
FIG. 3E is a diagram illustrating a step of oxide planarization and nitride removal in a fabrication process of the image sensor according to one embodiment of the invention.

FIG. 3E is a diagram illustrating a step of oxide planarization and nitride removal in a fabrication process of the image sensor according to one embodiment of the invention. This step includes planarizing the oxide fill 320 to create a shallow trench isolation (STI) 322 and removing the nitride layer 316.

Figure 3F:
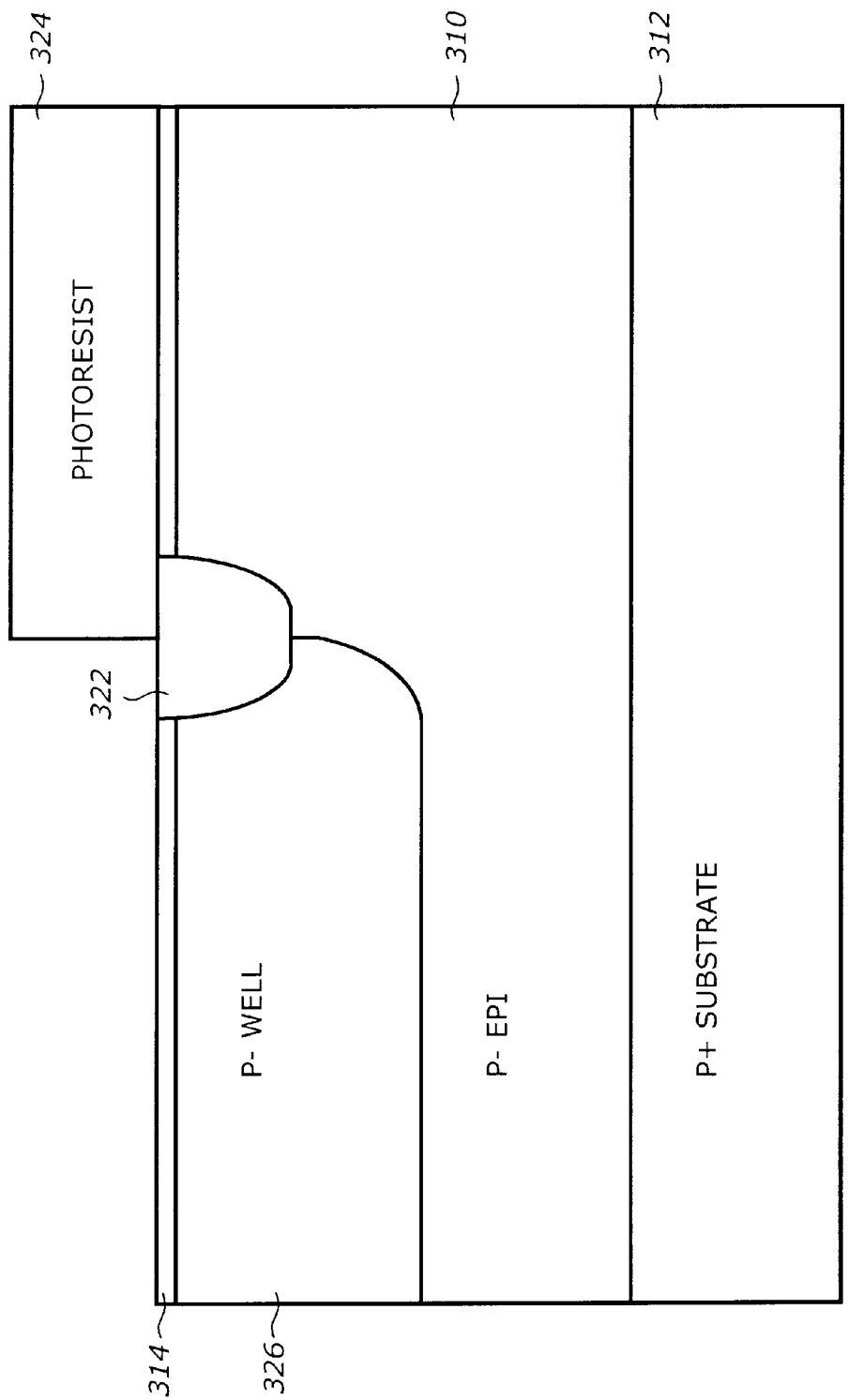
FIG. 3F is a diagram illustrating a step of P-well lithography and implant in a fabrication process of the image sensor according to one embodiment of the invention.

FIG. 3F is a diagram illustrating a step of P-well lithography and implant in a fabrication process of the image sensor according to one embodiment of the invention. This step includes depositing a photoresist 324 and forming a P-well region 326 by implantation.

Figure 3G:
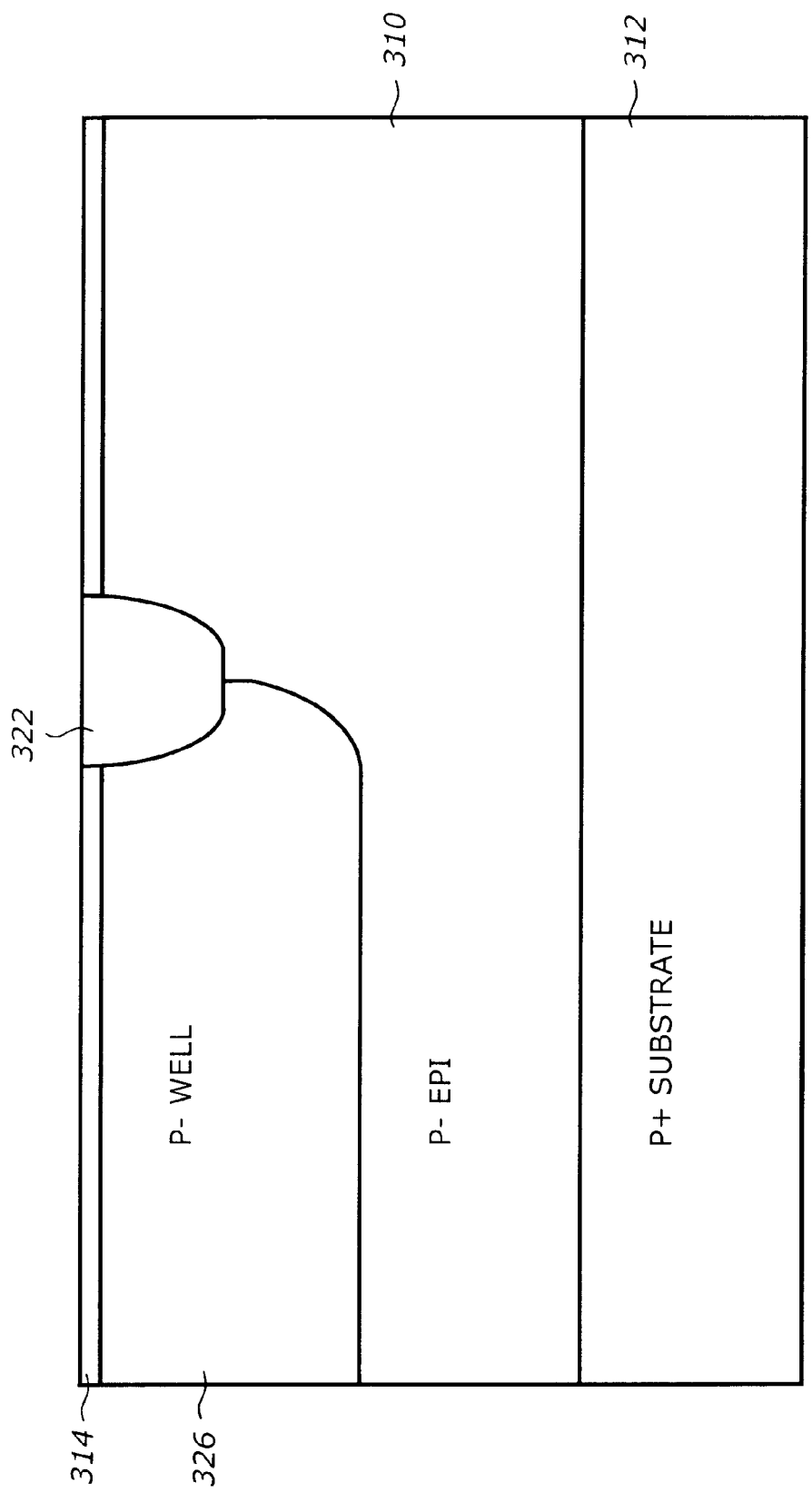
FIG. 3G is a diagram illustrating a step of P-well resist strip in a fabrication process of the image sensor according to one embodiment of the invention.

FIG. 3G is a diagram illustrating a step of P-well resist strip in a fabrication process of the image sensor according to one embodiment of the invention. This step includes removing the photoresist 324.

Figure 3H:
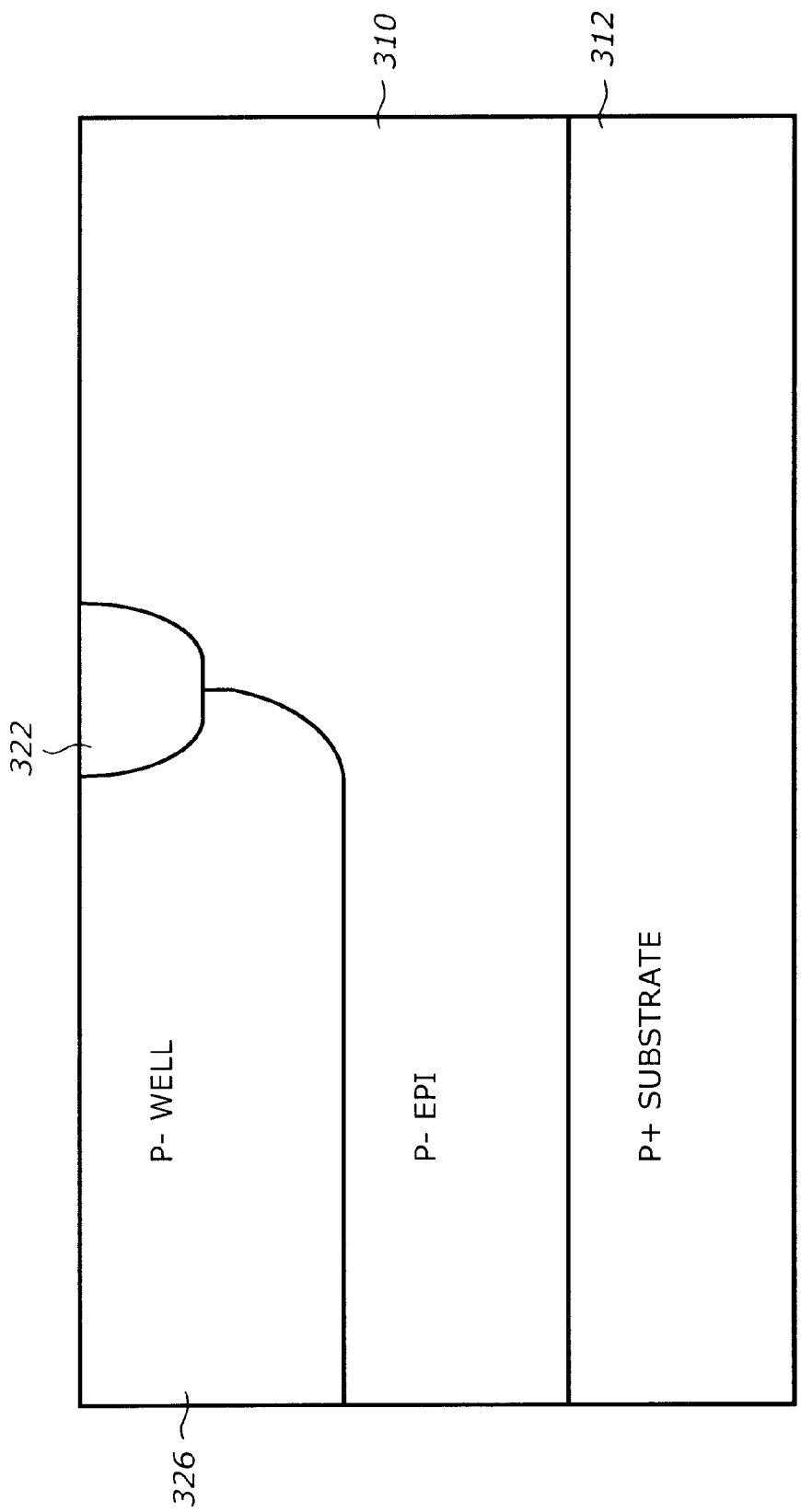
FIG. 3H is a diagram illustrating a step of gate oxide preclean in a fabrication process of the image sensor according to one embodiment of the invention.

FIG. 3H is a diagram illustrating a step of gate oxide preclean in a fabrication process of the image sensor according to one embodiment of the invention. This step precleans the silicon surface prior to gate oxidation by removing the oxide layer 314.

Figure 3I:
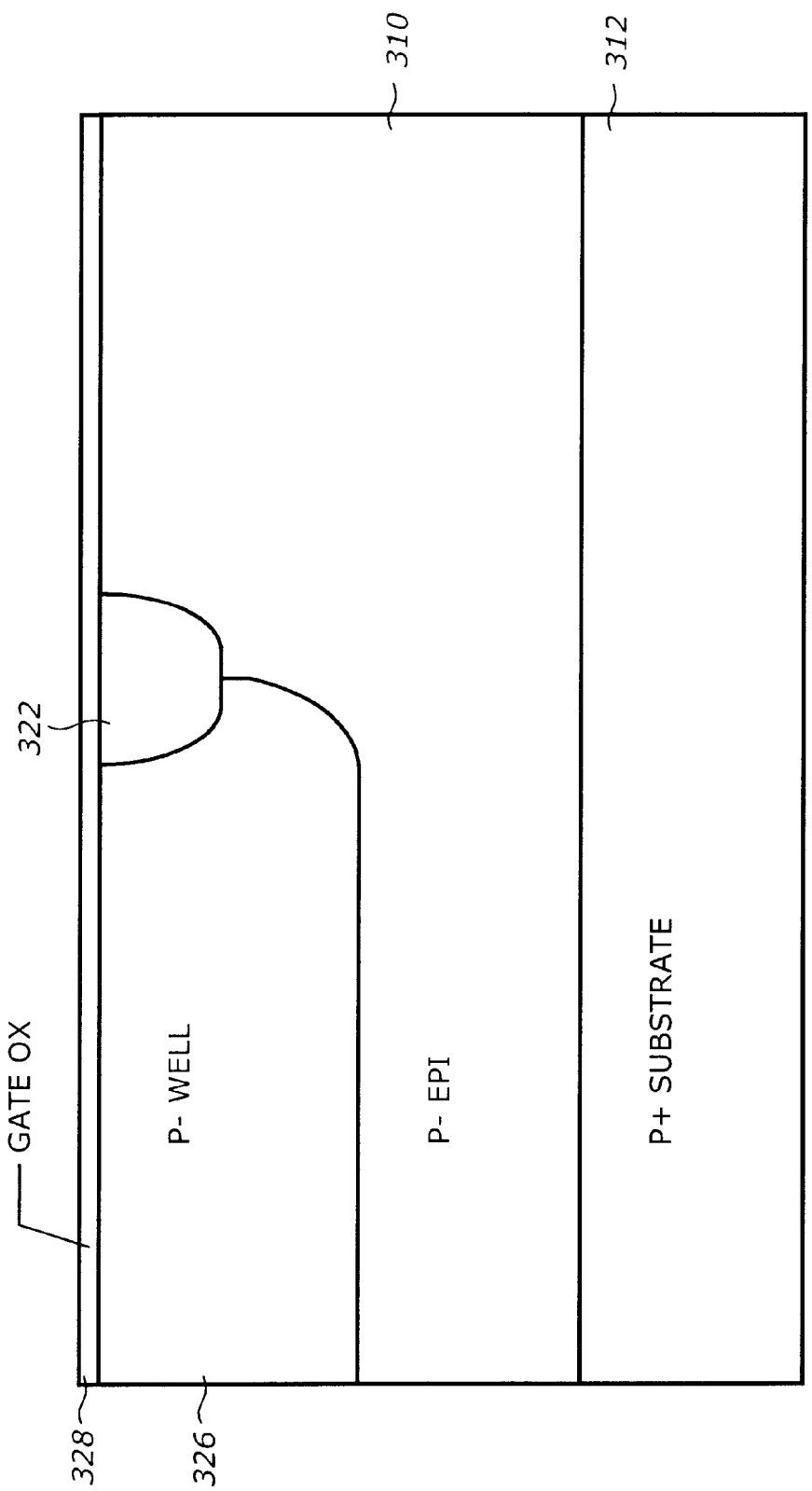
FIG. 3I is a diagram illustrating a step of gate oxidation in a fabrication process of the image sensor according to one embodiment of the invention.

FIG. 3I is a diagram illustrating a step of gate oxidation in a fabrication process of the image sensor according to one embodiment of the invention. This step grows a gate oxide layer 328 covering the P-well region 326, the STI 322 and the P-Epi layer 310 on the image sensor side.

Figure 3J:
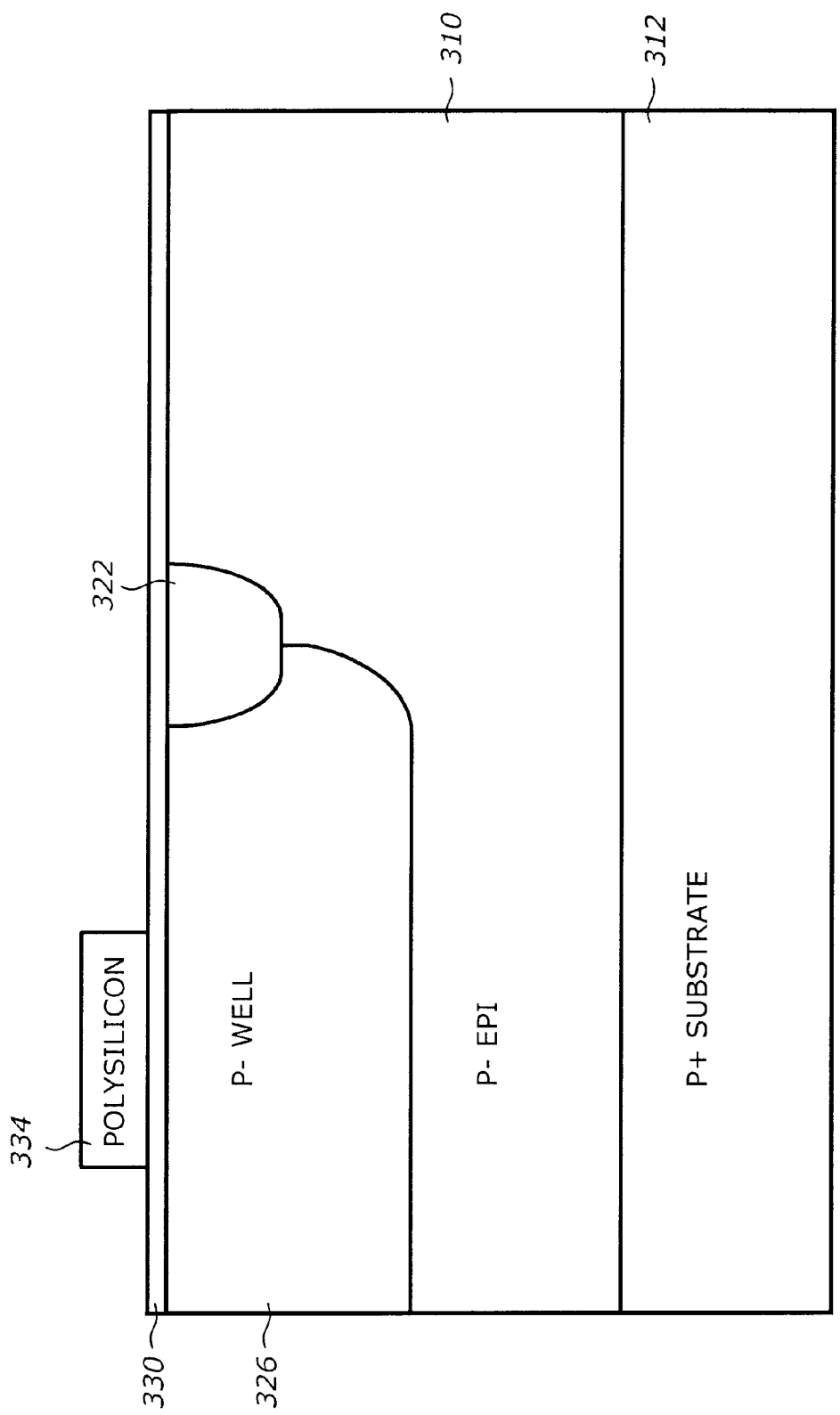
FIG. 3J is a diagram illustrating a step of polysilicon after deposition, lithography, etch, and resist strip in a fabrication process of the image sensor according to one embodiment of the invention.

FIG. 3J is a diagram illustrating a step of polysilicon after deposition, lithography, etch, and resist strip in a fabrication process of the image sensor according to one embodiment of the invention. This step includes depositing a polysilicon layer 334 and patterning to leave a gate structure on the transistor side.

Figure 3K:
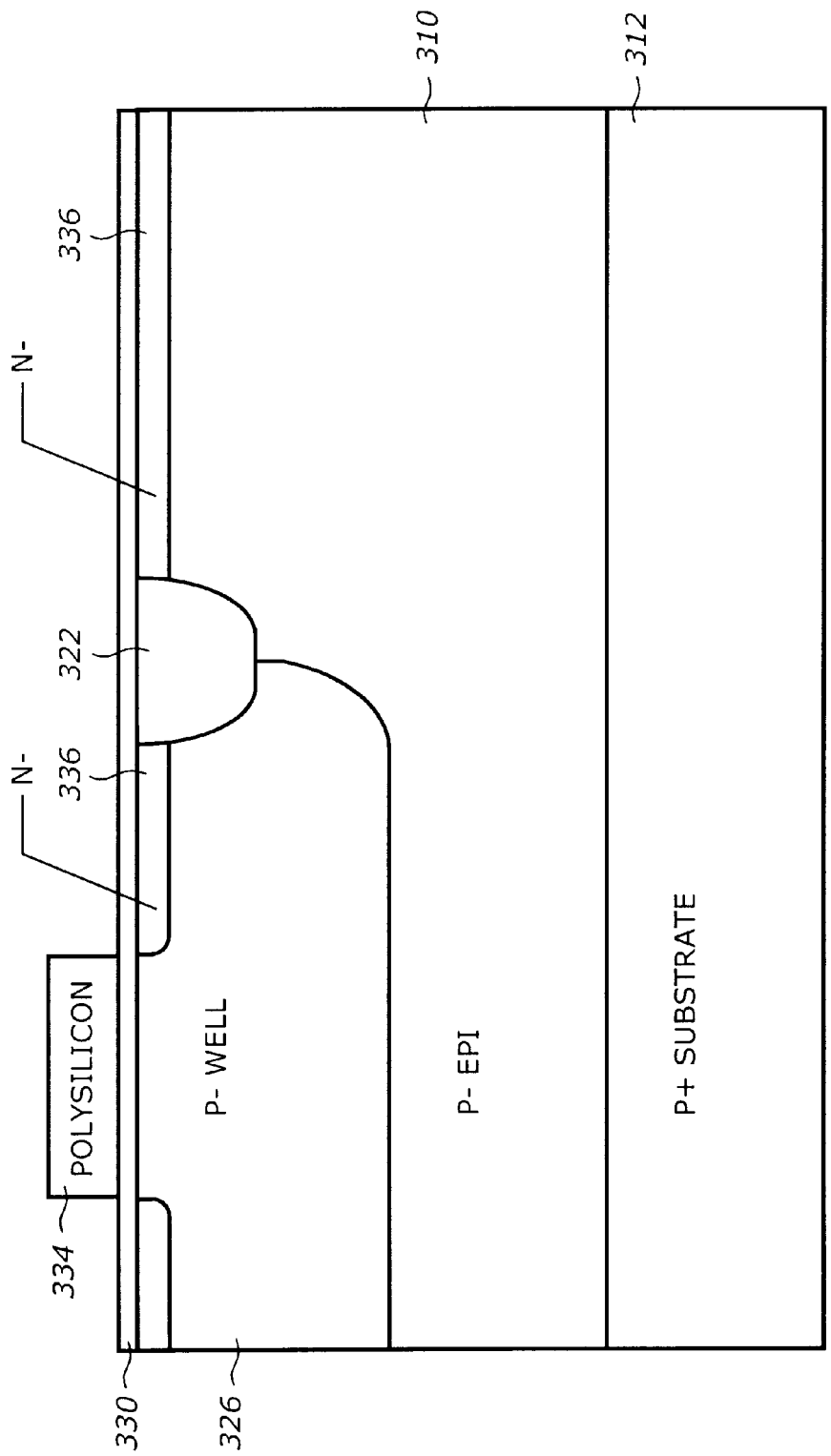
FIG. 3K is a diagram illustrating a step of process of N-tip implant of fabricating the image sensor according to one embodiment of the invention.

FIG. 3K is a diagram illustrating a step of N-tip implant in a fabrication process of the image sensor according to one embodiment of the invention. This step includes conditioning the polysilicon layer 334 and forming the N– layer 336 between the oxide layer 330 and the P-well and P-Epi regions 326 and 310, respectively.

Figure 3L:
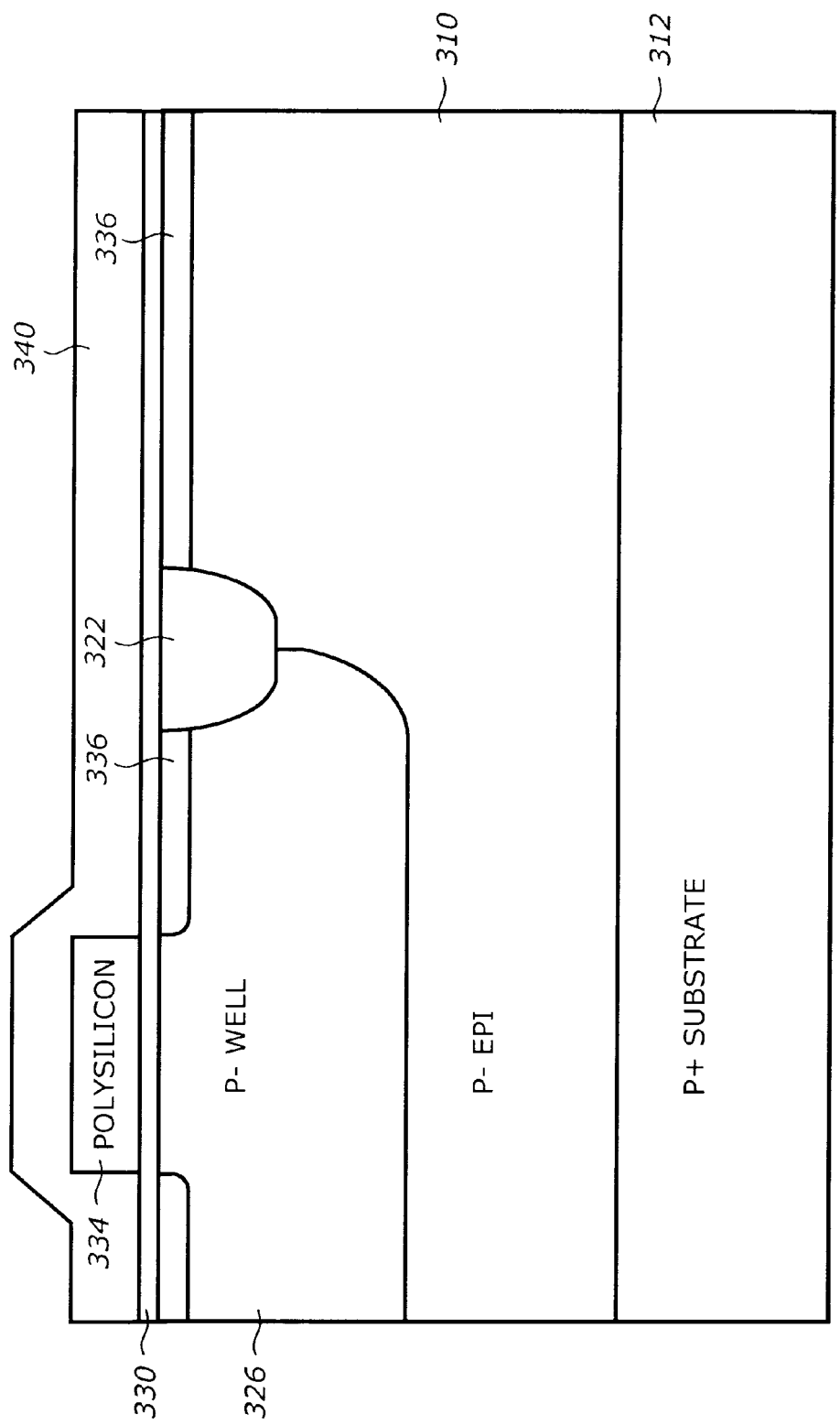
FIG. 3L is a diagram illustrating a step of spacer nitride deposition in a fabrication process of the image sensor according to one embodiment of the invention.

FIG. 3L is a diagram illustrating a step of spacer deposition in a fabrication process of the image sensor according to one embodiment of the invention. This step includes depositing a dielectric material 340 on the polysilicon layer 334 and the oxide layer 330. In one embodiment, the dielectric material is nitride. The thickness of this nitride layer is measured to match the desired optical response QE curve. The nitride layer 340 acts as a spacer between the photodiode N–/P– and the oxide layer subsequently formed.

Figure 3M:
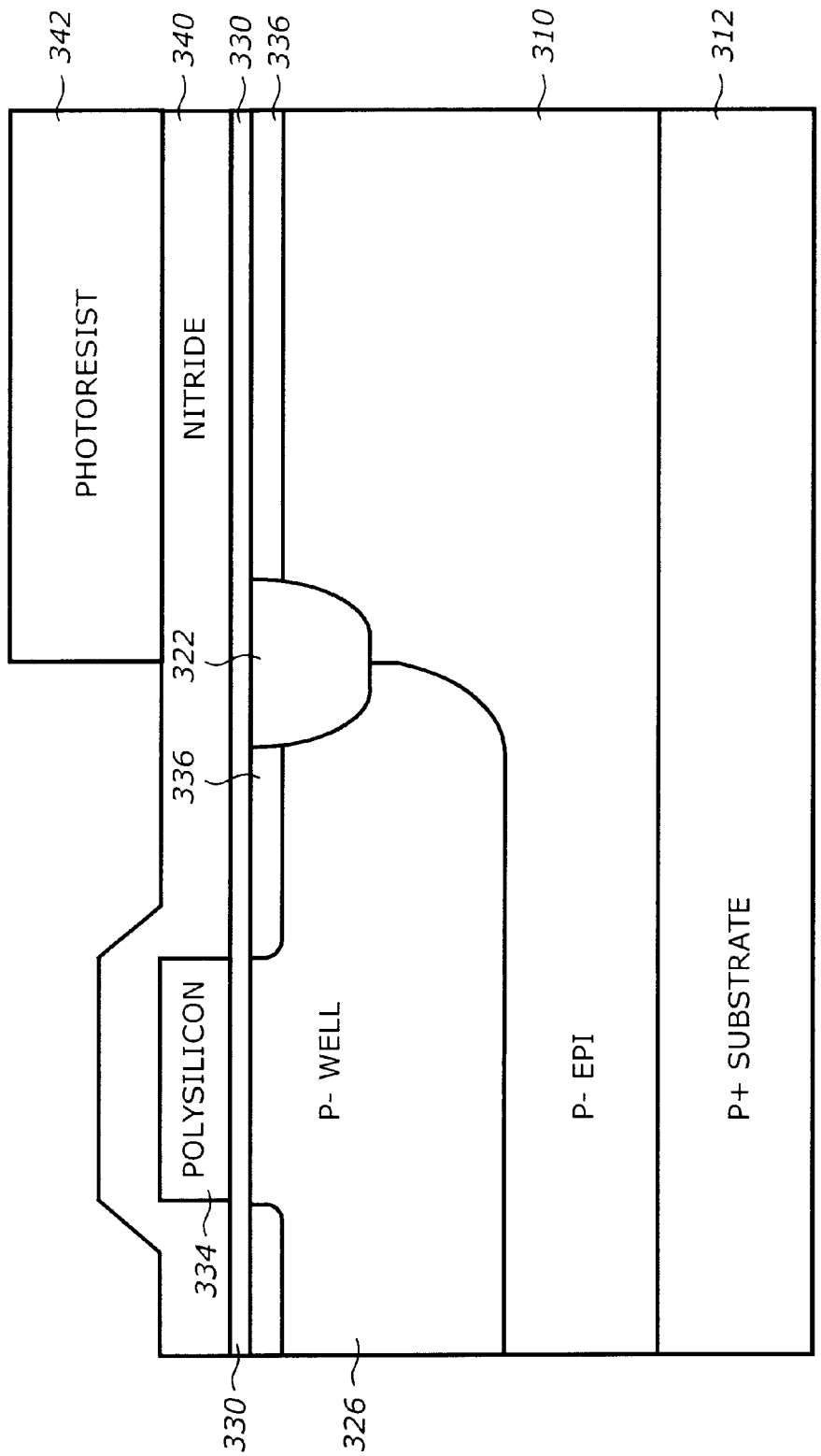
FIG. 3M is a diagram illustrating a step of spacer removal mask (SRM) lithography in a fabrication process of the image sensor according to one embodiment of the invention.

FIG. 3M is a diagram illustrating a step of spacer removal mask (SRM) lithography in a fabrication process of the image sensor according to one embodiment of the invention. This step includes depositing a photoresist layer 342 on the nitride layer 340.

Figure 3N:
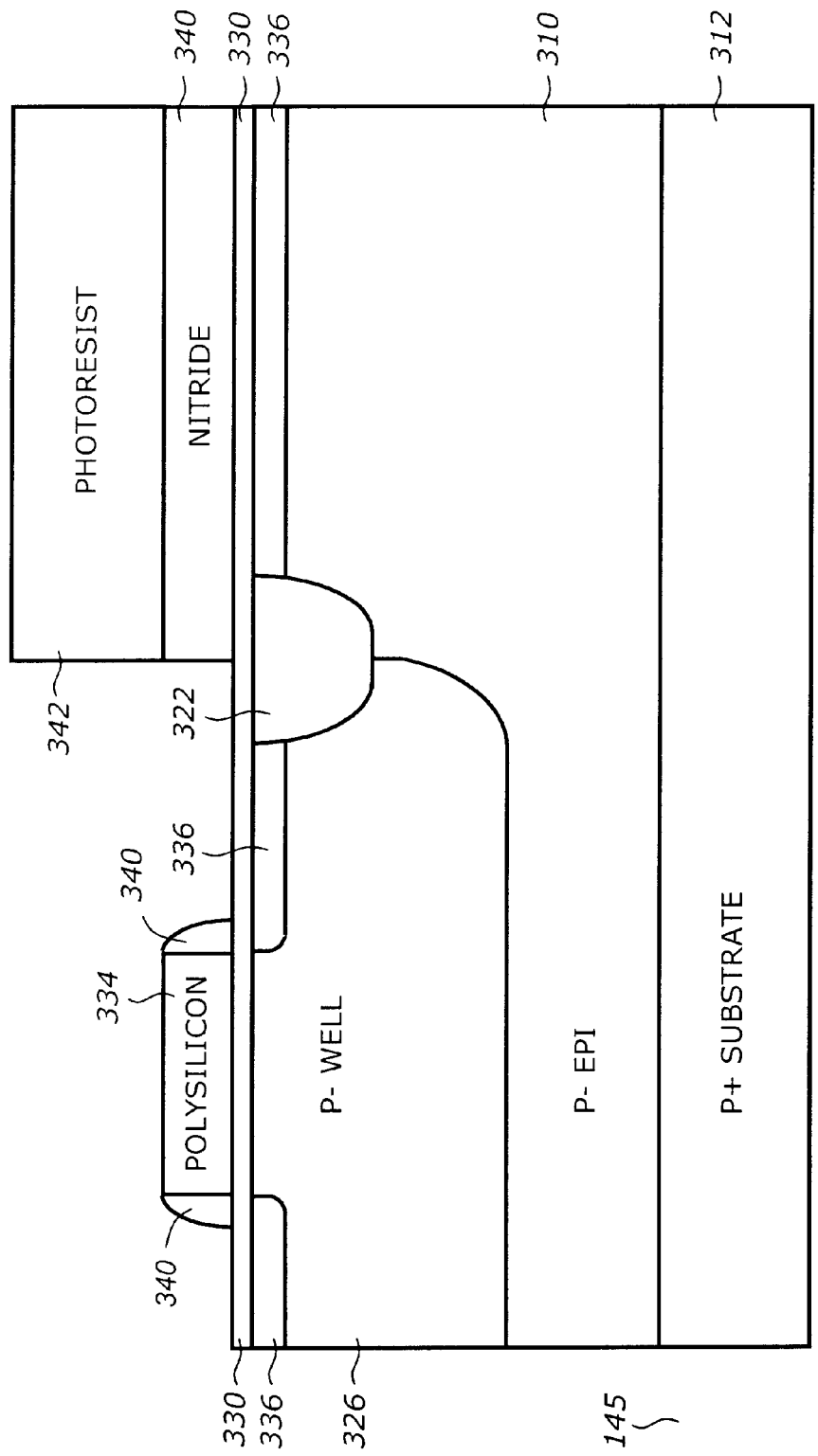
FIG. 3N is a diagram illustrating a step of spacer etch in a fabrication process of the image sensor according to one embodiment of the invention.
Figure 30:
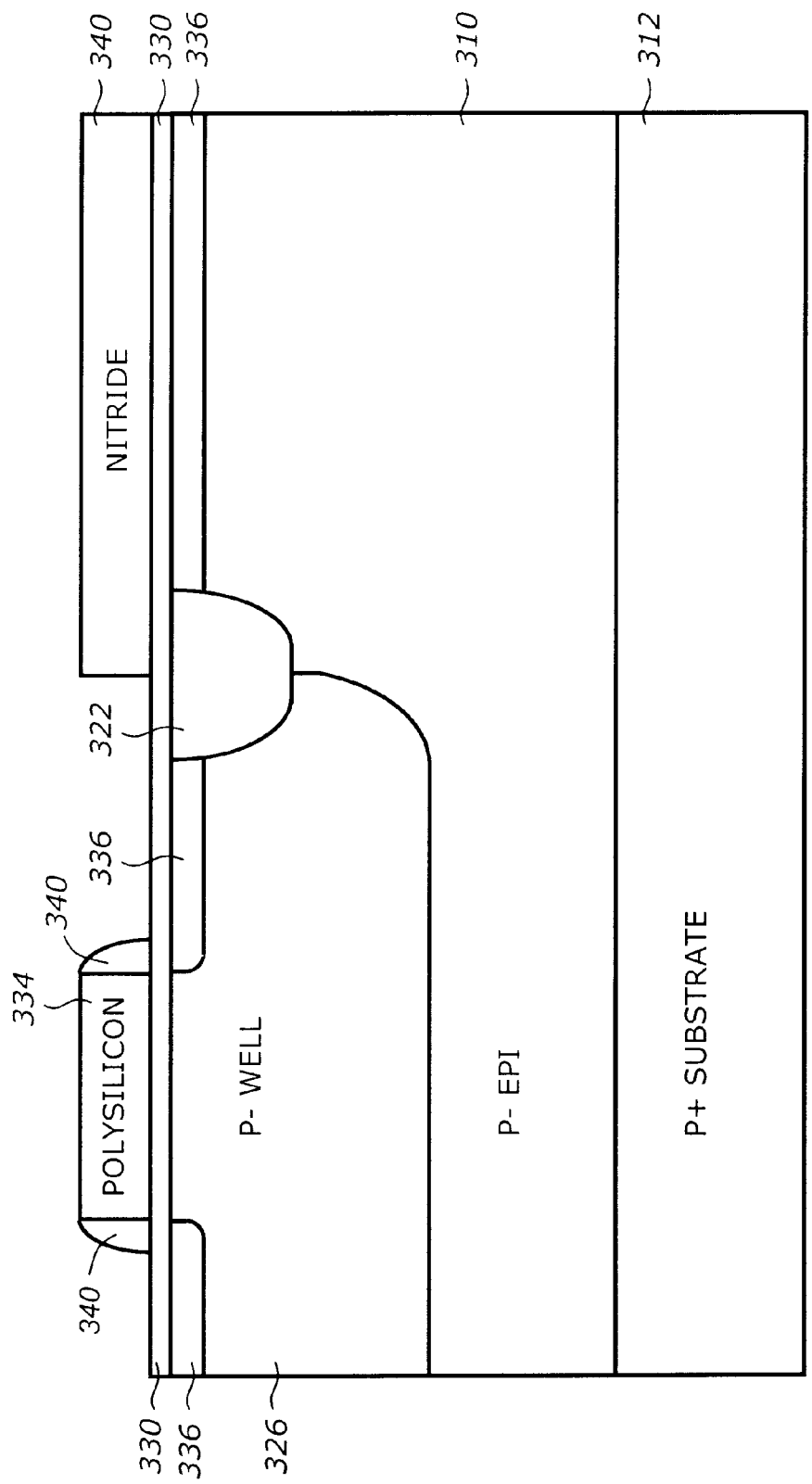

FIG. 3N is a diagram illustrating a step of spacer etch in a fabrication process of the image sensor according to one embodiment of the invention. This step includes etching the nitride layer 340 on the transistor side, leaving the nitride layer 340 on the image sensor side and sidewall spacer structures on the transistor.

FIG. 3O is a diagram illustrating a step of SRM ash/sulfuric clean in a fabrication process of the image sensor according to one embodiment of the invention. This step includes cleaning and removing the photoresist layer 342, leaving the nitride layer 340.

Figure 3P:
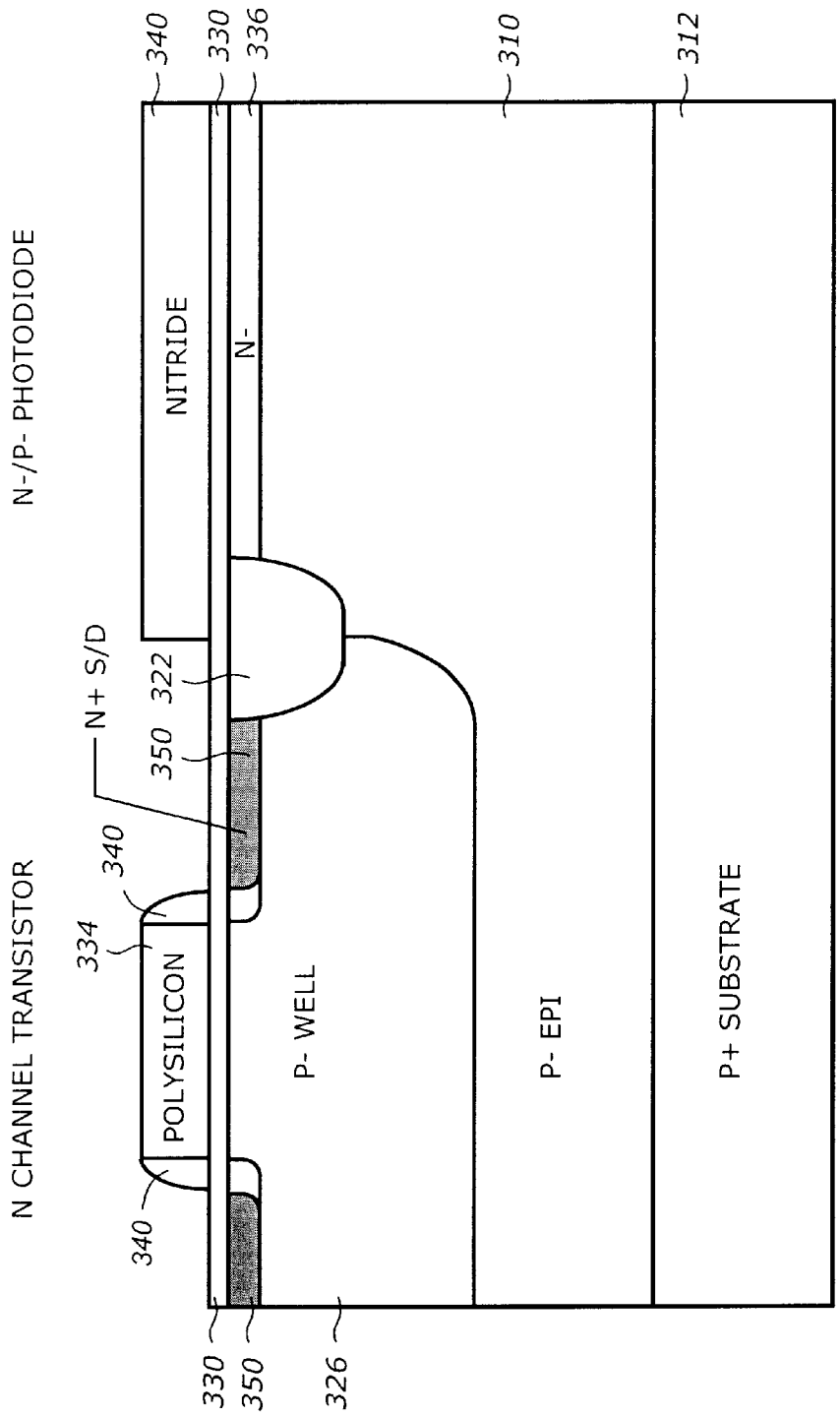
FIG. 3P is a diagram illustrating a step of N+ source/drain (NSD) lithography and implant in a fabrication process of the image sensor according to one embodiment of the invention.

FIG. 3P is a diagram illustrating a step of N+ source/drain (NSD) lithography and implant in a fabrication process of the image sensor according to one embodiment of the invention. This step includes forming an N+ region 350 on the N-channel transistor side.

Figure 3Q:
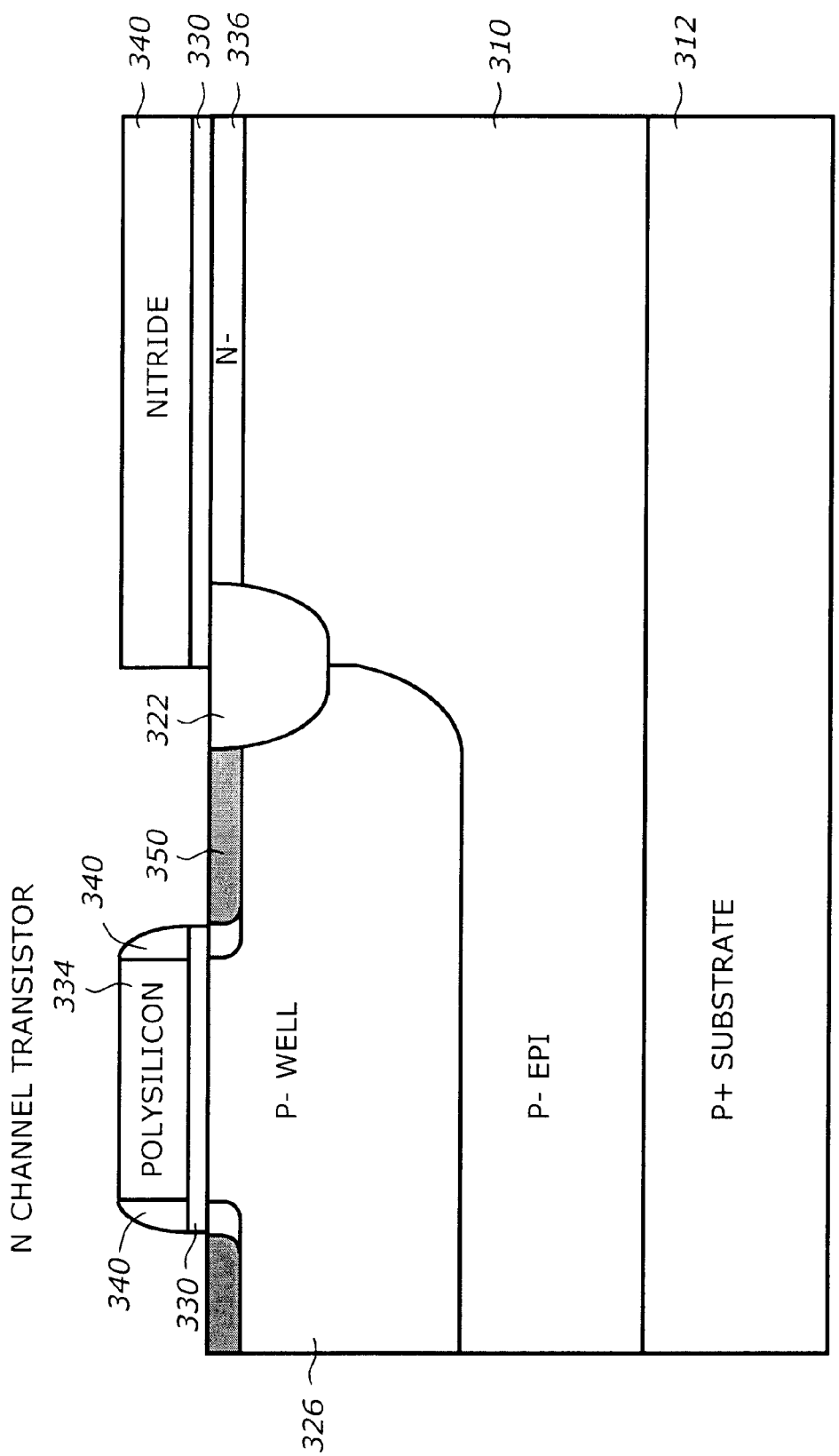
FIG. 3Q is a diagram illustrating a step of oxide removal in a fabrication process of the image sensor according to one embodiment of the invention.

FIG. 3Q is a diagram illustrating a step of oxide removal in a fabrication process of the image sensor according to one embodiment of the invention. This step includes removing the oxide layer 330 outside the polysilicon layer 334 and the nitride layer 340.

Figure 3R:
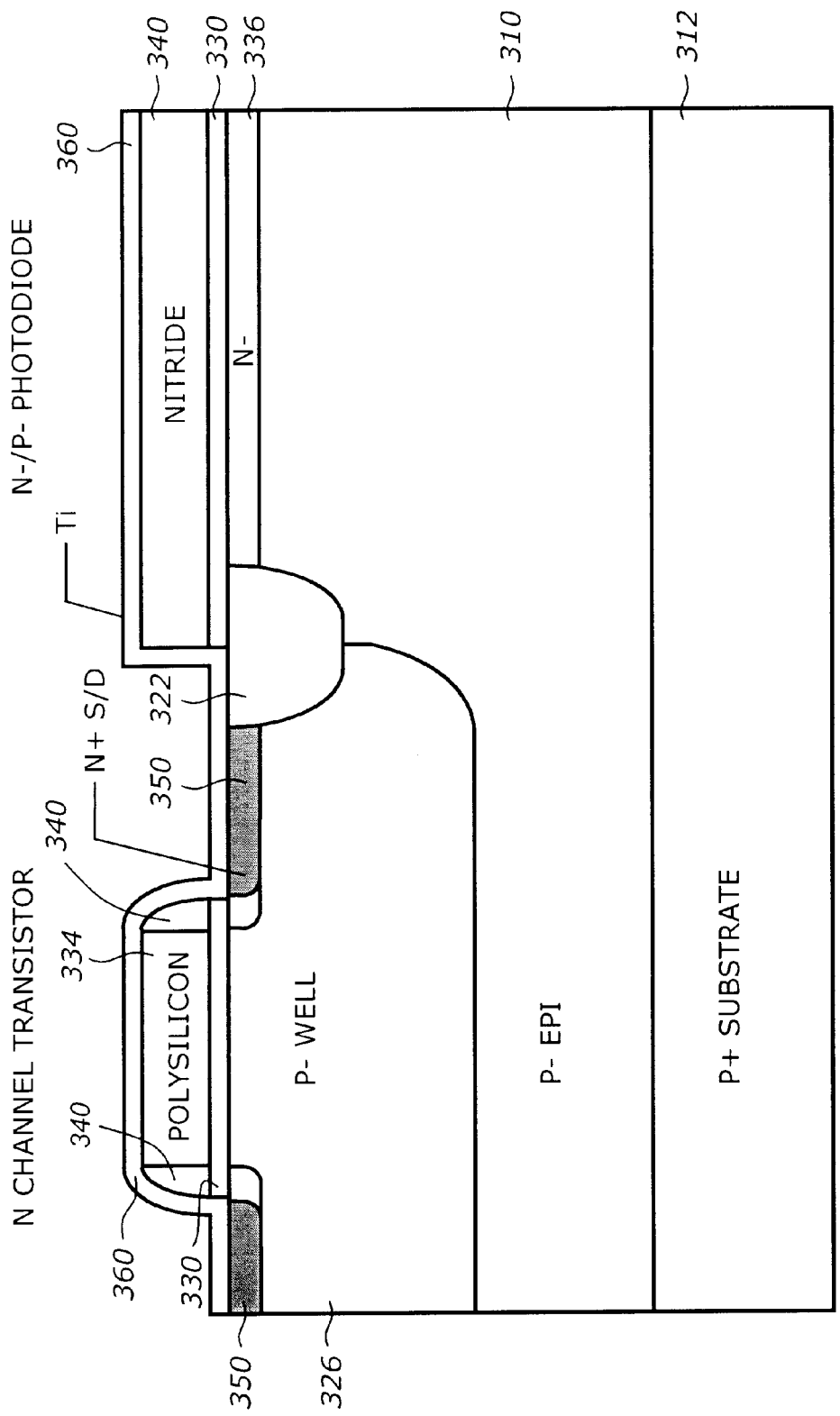
FIG. 3R is a diagram illustrating a step of Titanium (Ti) sputtering in a fabrication process of the image sensor according to one embodiment of the invention.

FIG. 3R is a diagram illustrating a step of Titanium (Ti) sputtering in a fabrication process of the image sensor according to one embodiment of the invention. This steps includes depositing a thin film of Titanium 360 on the entire surface.

Figure 3S:
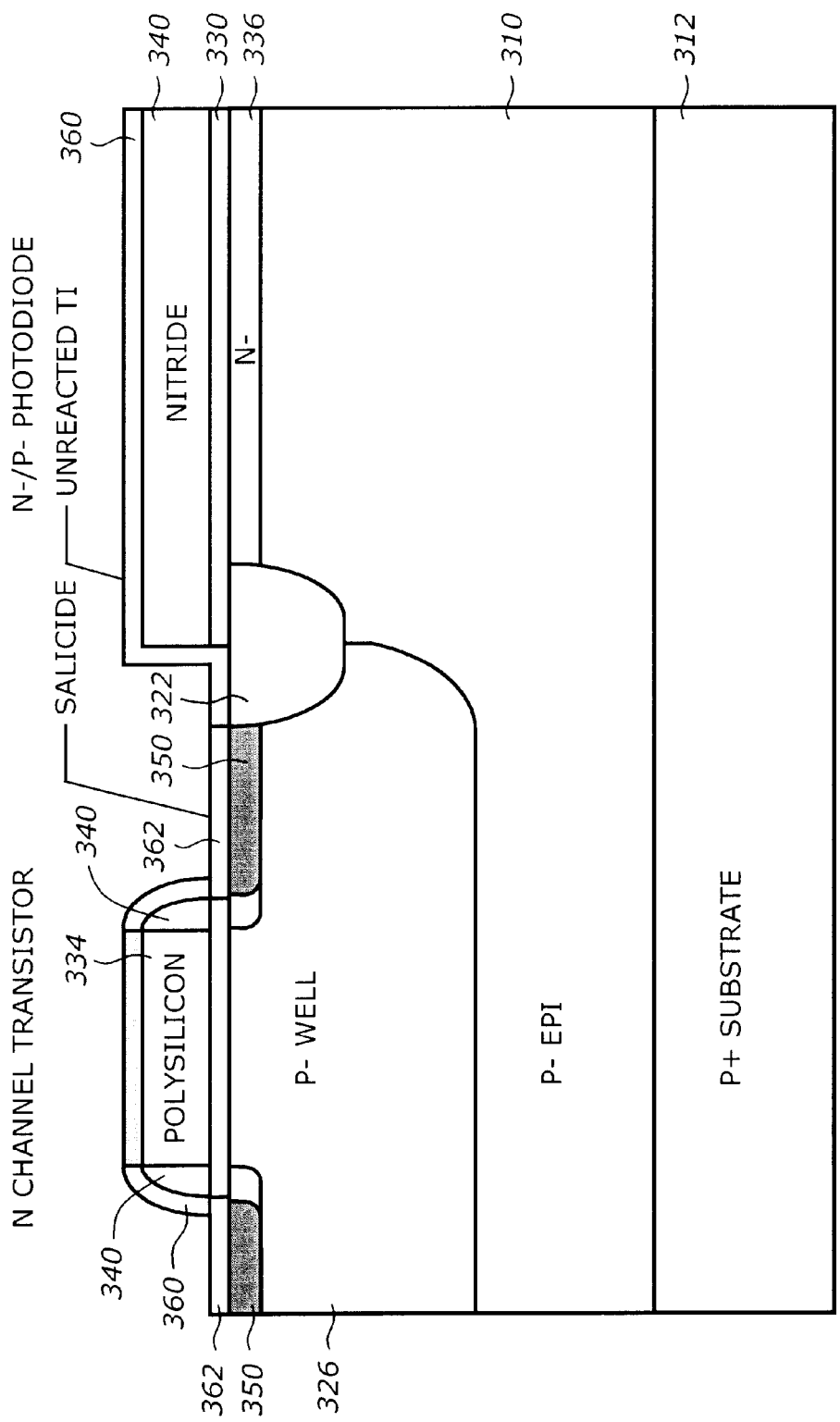
FIG. 3S is a diagram illustrating a step of Titanium reaction or salicide formation in a fabrication process of the image sensor according to one embodiment of the invention.

FIG. 3S is a diagram illustrating a step of Titanium reaction or salicide formation in a fabrication process of the image sensor according to one embodiment of the invention. This step includes forming a layer 362 on the polysilicon layer 334 and forming a salicide layer 362 on the N+ region 350. The Titanium portion on the nitride layer 340 remains unreacted.

Figure 3T:
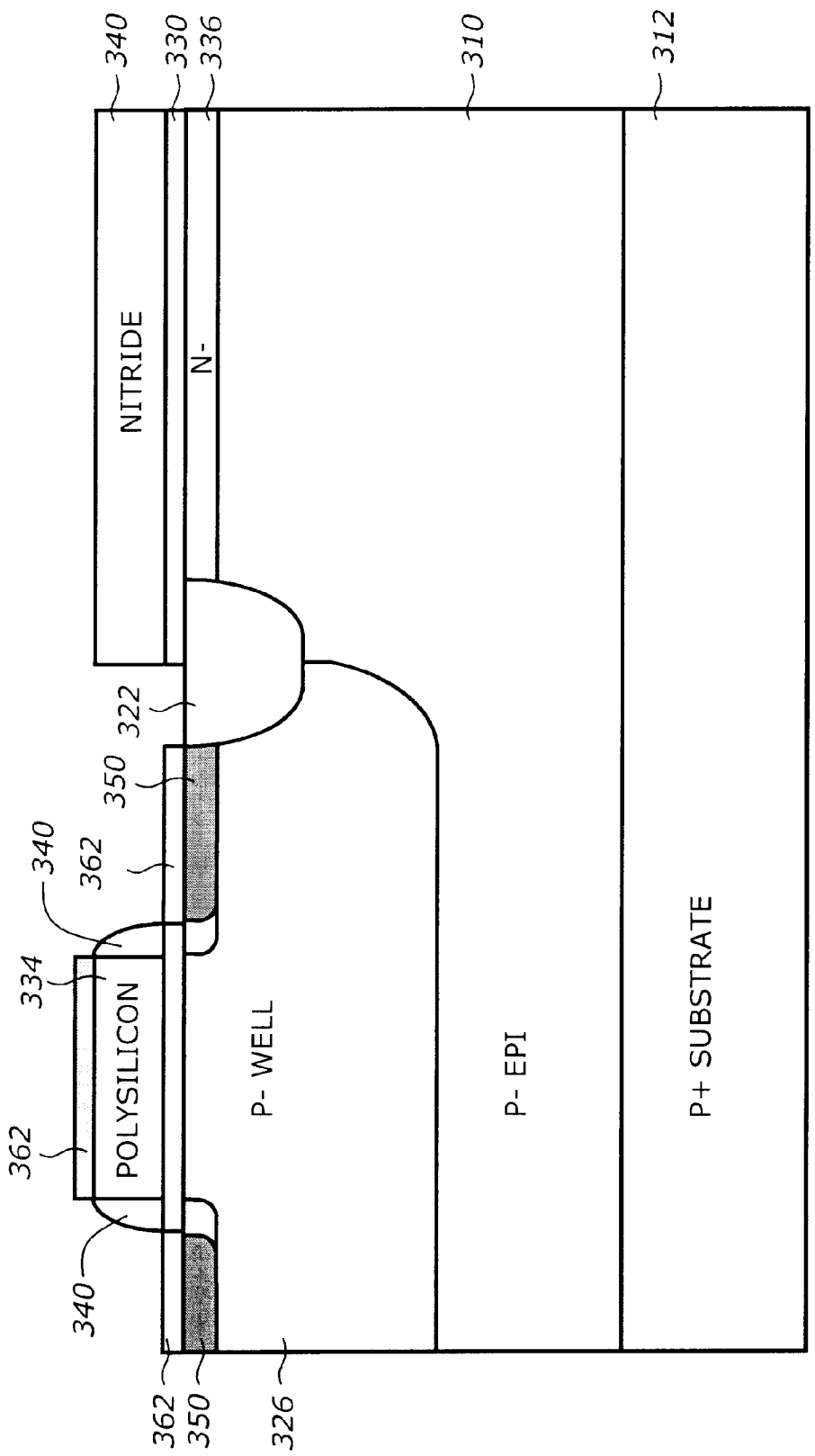
FIG. 3T is a diagram illustrating a step of Titanium etch in a fabrication process of the image sensor according to one embodiment of the invention.

FIG. 3T is a diagram illustrating a step of Titanium etch in a fabrication process of the image sensor according to one embodiment of the invention. This step includes etching the Titanium layer.

Figure 3U:
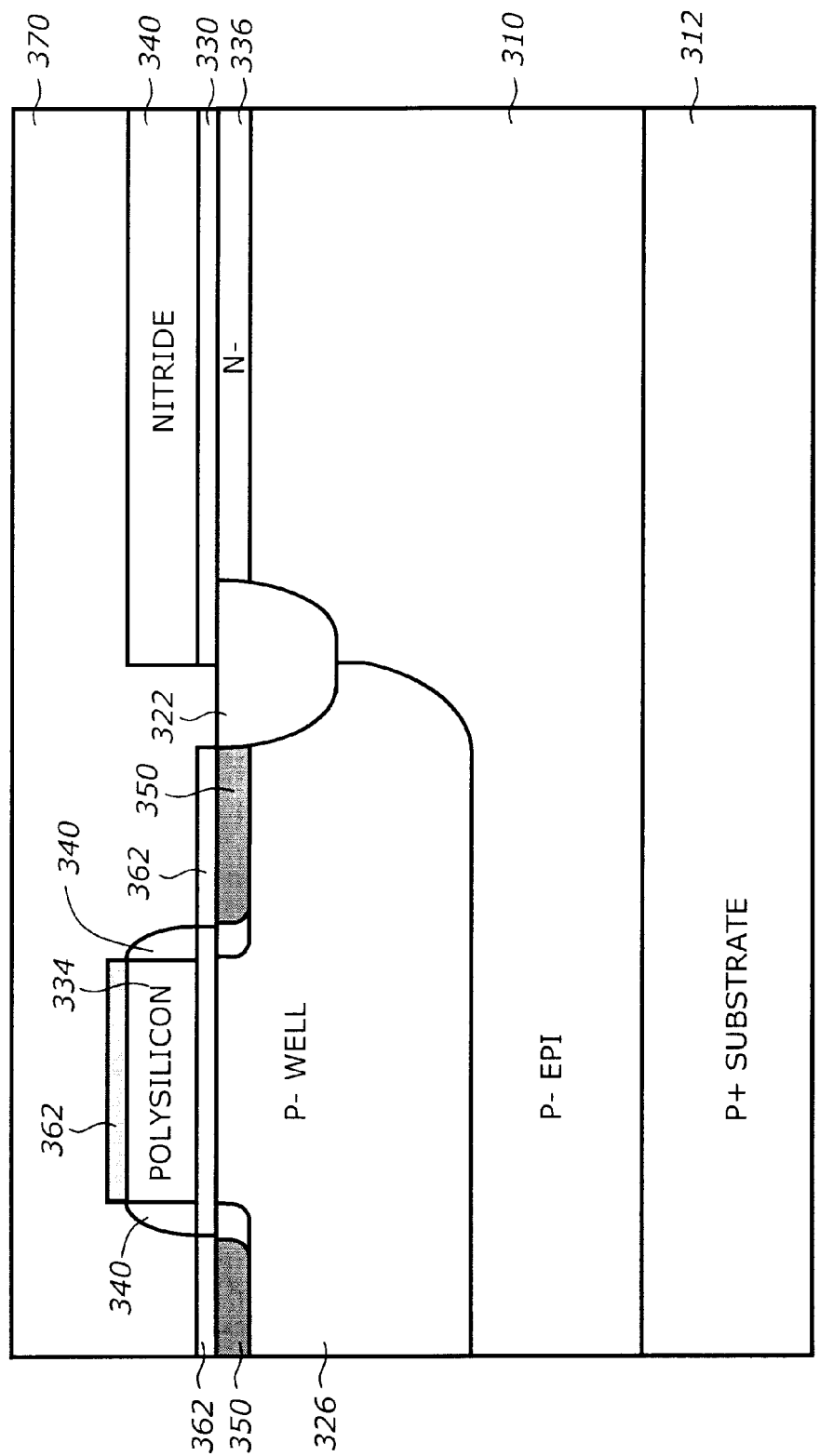
FIG. 3U is a diagram illustrating a step of ILD0 deposition in a fabrication process of the image sensor according to one embodiment of the invention.

FIG. 3U is a diagram illustrating a step of ILD0 deposition in a fabrication process of the image sensor according to one embodiment of the invention. This step includes forming an oxide layer 370.

Figure 3V:
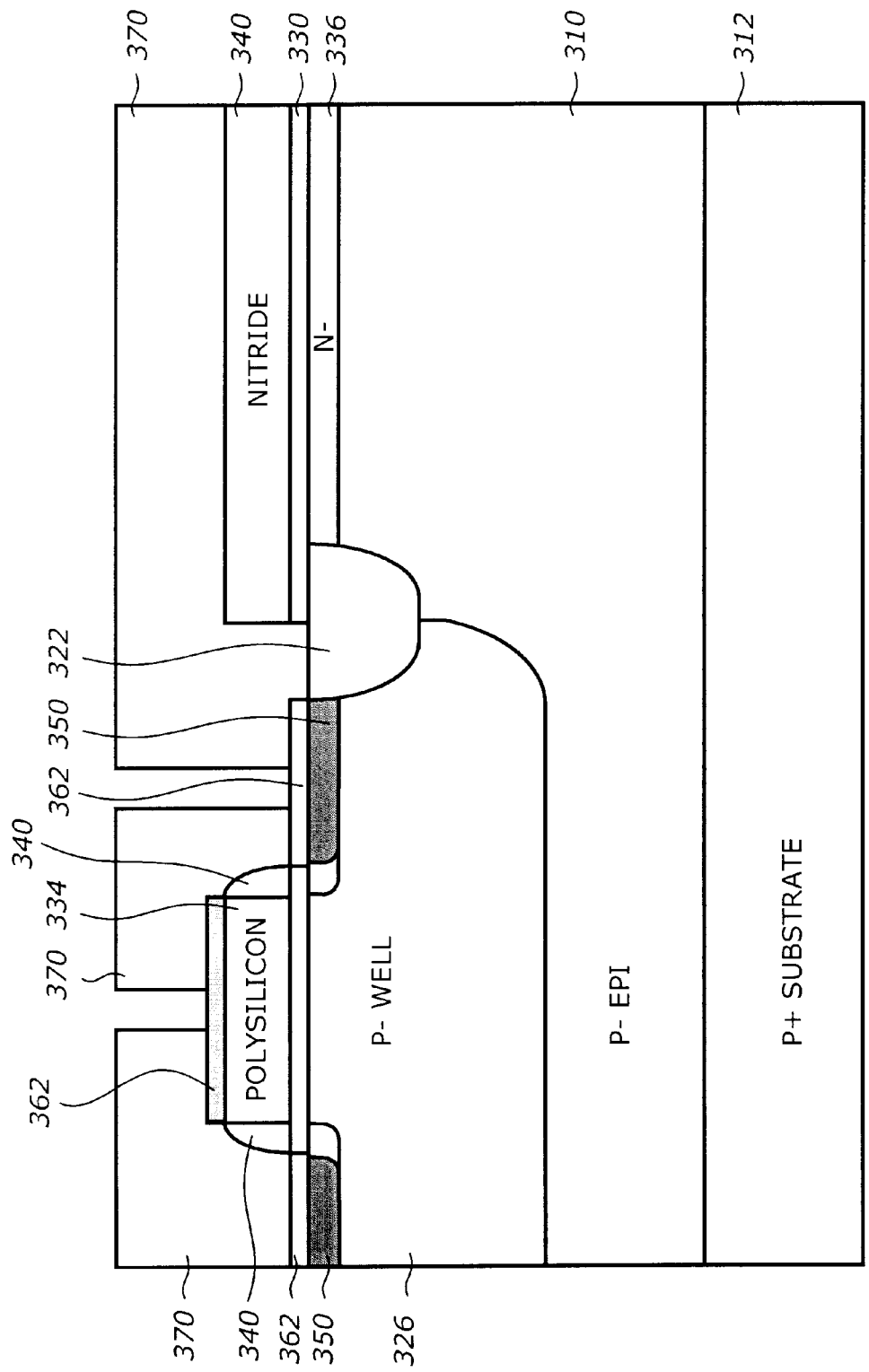
FIG. 3V is a diagram illustrating a step of contact lithography, etch, and resist strip in a fabrication process of the image sensor according to one embodiment of the invention.

FIG. 3V is a diagram illustrating a step of contact lithography, etch, and resist strip in a fabrication process of the image sensor according to one embodiment of the invention. This step includes patterning contact points, oxide etching, and resist strip.

Figure 3W:
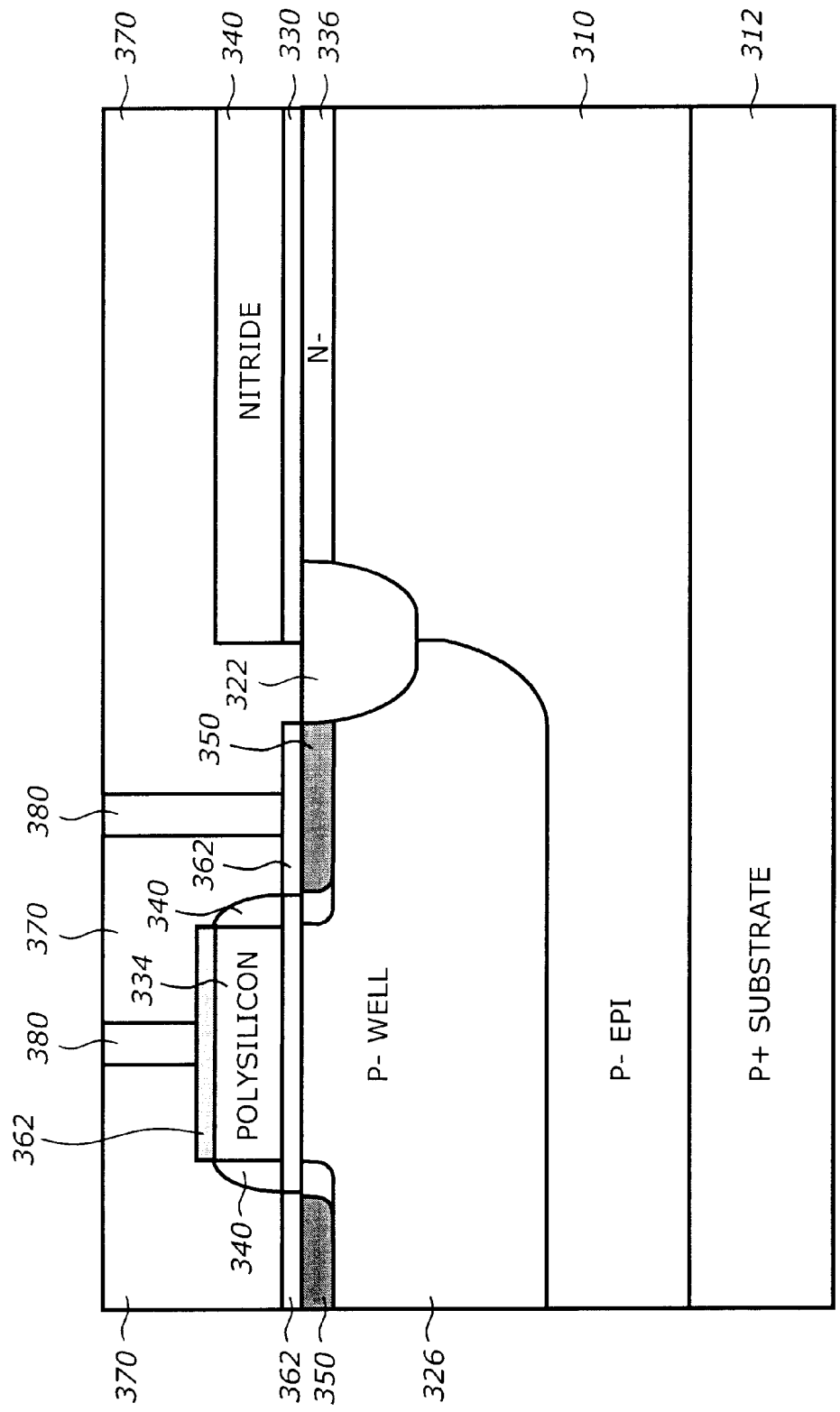
FIG. 3W is a diagram illustrating a step of Tungsten deposition and polish in a fabrication process of the image sensor according to one embodiment of the invention.
Figure 3X:
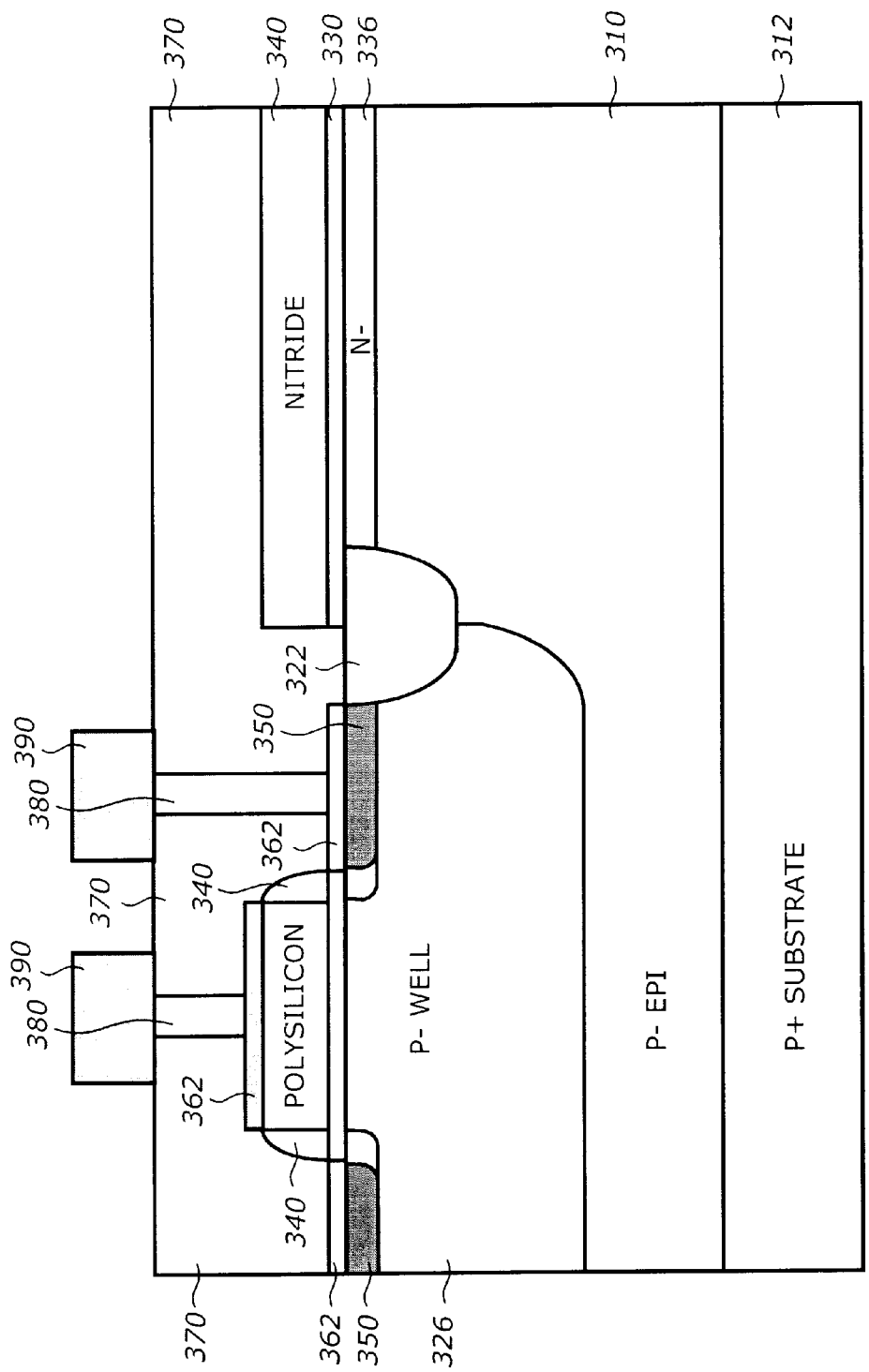
FIG. 3X is a diagram illustrating a step of metal 1 deposition, lithography, etch, and resist strip in a fabrication process of the image sensor according to one embodiment of the invention.

FIG. 3W is a diagram illustrating a step of Tungsten deposition and polish in a fabrication process of the image sensor according to one embodiment of the invention. This step includes depositing in the contact openings with Tungsten 380.

FIG. 3X is a diagram illustrating a step of metal 1 deposition, lithography, etch, and resist strip in a fabrication process of the image sensor according to one embodiment of the invention. This step includes depositing a metal layer 390, etch, and resist strip to form interconnect lines.

The above sequence of steps constitutes the basic fabrication process of the image sensor with enhanced QE. There may be additional metal layers that can be created by conventional methods known to those skilled in the art. The n-channel transistor steps show that the image sensor is fabricated using the standard CMOS logic technology process. In addition to the above steps, there may also be steps to form a color filter array (CFA) and a microlens as part of a complete fabrication process of an image sensor. These steps can be formed by conventional methods known to those skilled in the art.

The present invention provides an efficient technique to improve the quantum efficiency (QE) of an image sensor. The technique is simple and provides a significant performance improvement and control flexibility.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method to fabricate an image sensor, the method comprising:

forming a photodiode responsive to an amount of incident light from a light source; and embedding a dielectric structure containing a dielectric material between the photodiode and an inter-level dielectric (ILD) oxide layer, the dielectric structure being on top of the photodiode and having a refractive index higher than refractive index of the photodiode and the ILD oxide layer, the ILD oxide layer being made of an oxide material and having an ILD thickness oxide material and having an ILD thickness.

2. The method of claim 1 wherein forming the photodiode further comprising:

forming a first semiconductor layer of semiconductor material of a first conductivity type on a substrate; and forming a second semiconductor layer of semiconductor material of a second conductivity type on the first semiconductor layer.

3. The method of claim 1 wherein the ILD thickness ranges from 5 $\mu$m to 6 $\mu$m.

4. The method of claim 1 wherein the dielectric material is nitride.

5. The method of claim 2 wherein embedding the dielectric structure further comprising:

forming a buffer oxide layer on the second semiconductor layer, the buffer oxide layer being made of an oxide material and having a buffer thickness; and forming a dielectric layer of the dielectric material between the buffer oxide layer and the ILD oxide layer, the dielectric layer having a dielectric thickness.

6. The method of claim 2 wherein the first conductivity type includes p type and the second conductivity type includes n type.

7. The method of claim 5 further comprising a passivation layer made of a dielectric material, the passivation layer having a passivation thickness.

8. The method of claim 5 wherein the buffer thickness ranges from 100 Å to 200 Å.

9. The method of claim 5 wherein the dielectric thickness ranges from 1500 Å to 2200 Å.

10. The method of claim 7 wherein the passivation thickness ranges from 7000 Å to 8000 Å.

11. The method of claim 7 wherein the dielectric material is nitride.

12. An image sensor comprising:
   a photodiode responsive to an amount of incident light from a light source; and
   a dielectric structure placed between the photodiode and an inter-level dielectric (ILD) oxide layer, the dielectric structure containing a dielectric material, the dielectric structure being on top of the photodiode and having a refractive index higher than refractive index of the photodiode and the ILD oxide layer, the ILD oxide layer being made of an oxide material and having an ILD oxide thickness.

13. The image sensor of claim 12 wherein the photodiode further comprising:
   a first semiconductor layer of semiconductor material of a first conductivity type on a substrate; and
   a second semiconductor layer of semiconductor material of a second conductivity type on the first semiconductor layer.

14. The image sensor of claim 12 wherein the ILD oxide thickness ranges from 5 $\mu$m to 6 $\mu$m.

15. The image sensor of claim 12 wherein the dielectric material is nitride.

16. The image sensor of claim 13 wherein the dielectric structure further comprising:
   a buffer oxide layer made of an oxide material on the second semiconductor layer, the buffer oxide layer having a buffer thickness; and
   a dielectric layer of the dielectric material placed between the buffer oxide layer and the ILD oxide layer, the dielectric layer having a dielectric thickness.

17. The image sensor of claim 13 wherein the first conductivity type includes p type and the second conductivity type includes n type.

18. The image sensor of claim 12 further comprising a passivation layer made of a dielectric material, the passivation having a passivation thickness.

19. The image sensor of claim 16 wherein the buffer thickness ranges from 100 Å to 200 Å.

20. The image sensor of claim 16 wherein the dielectric thickness ranges from 1500 Å to 2200 Å.

21. The image sensor of claim 18 wherein the passivation thickness ranges from 7000 Å to 8000 Å.

22. The image sensor of claim 18 wherein the dielectric material is nitride.

23. An imaging system comprising:
   an image sensor, the image sensor comprising:
      a photodiode to generate image data corresponding to an amount of light from a light source, and
      a dielectric structure containing a dielectric material between the photodiode and an inter-level dielectric (ILD) oxide layer, the dielectric structure being on top of the photodiode and having a refractive index higher than refractive index of the photodiode and the ILD oxide layer, the ILD oxide layer being made of an oxide material and having an ILD thickness;
   a sensor interface circuit coupled to the image sensor to obtain the image data; and
   a processor coupled to the sensor interface circuuit to process the image data.

24. The imaging system of claim 23 wherein the photodiode further comprising:
   a first semiconductor layer of semiconductor material of a first conductivity type on a substrate; and
   a second semiconductor layer of semiconductor material of a second conductivity type on the first semiconductor layer.

25. The imaging system of claim 23 wherein the ILD thickness ranges from 5 $\mu$m to 6 $\mu$m.

26. The imaging system of claim 23 wherein the dielectric material is nitride.

27. The imaging system of claim 24 wherein the dielectric structure further comprising:
   a buffer oxide layer made of an oxide material on the second semiconductor layer, the buffer oxide layer having a buffer thickness; and
   a dielectric layer of the dielectric material placed between the buffer oxide layer and the ILD oxide layer, the dielectric layer having a dielectric thickness.

28. The imaging system of claim 24 wherein the first conductivity type includes p type and the second conductivity type includes n type.

29. The imaging system of claim 23 further comprising:
   an image memory coupled to the image sensor to store the image data; and
   a communication interface circuit coupled to the processor to transfer the image data to other devices.

* * * * *